(12) United States Patent
Sasaki et al.

(10) Patent No.: US 10,490,731 B2
(45) Date of Patent: Nov. 26, 2019

(54) SPIN CURRENT MAGNETIZATION ROTATIONAL ELEMENT, MAGNETORESISTANCE EFFECT ELEMENT AND MAGNETIC MEMORY

(71) Applicant: TDK CORPORATION, Tokyo (JP)

(72) Inventors: Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/777,884

(22) PCT Filed: Nov. 25, 2016

(86) PCT No.: PCT/JP2016/084968
§ 371 (c)(1),
(2) Date: May 21, 2018

(87) PCT Pub. No.: WO2017/090726
PCT Pub. Date: Jun. 1, 2017

(65) Prior Publication Data
US 2018/0351082 A1    Dec. 6, 2018

(30) Foreign Application Priority Data

Nov. 27, 2015   (JP) ................................ 2015-232334
Mar. 16, 2016   (JP) ................................ 2016-053072
(Continued)

(51) Int. Cl.
*H01L 43/06*    (2006.01)
*G11B 5/39*     (2006.01)
(Continued)

(52) U.S. Cl.
CPC ............ *H01L 43/06* (2013.01); *G01R 33/098* (2013.01); *G11B 5/39* (2013.01); *G11C 11/161* (2013.01);
(Continued)

(58) Field of Classification Search
CPC ......... H01L 43/06; H01L 43/14; H01L 43/10; H03B 15/006; G01R 33/098
(Continued)

(56) References Cited

U.S. PATENT DOCUMENTS

| | | | |
|---|---|---|---|
| 4,785,241 A | 11/1988 | Abiko et al. | |
| 6,754,100 B1 | 6/2004 | Hayakawa | |

(Continued)

FOREIGN PATENT DOCUMENTS

| | | |
|---|---|---|
| JP | 2009194070 A | 8/2009 |
| JP | 2014045196 A | 3/2014 |

(Continued)

OTHER PUBLICATIONS

I.M. Miron et al., "Perpendicular switching of a single ferromagnetic layer induced by in-plane current injection", Nature, 476, pp. 189-194, 2011.

(Continued)

*Primary Examiner* — Bo Fan
(74) *Attorney, Agent, or Firm* — Oliff PLC

(57) ABSTRACT

This spin current magnetization rotational element includes a second ferromagnetic metal layer having a variable magnetization orientation, and spin-orbit torque wiring, which extends in a direction that intersects a direction perpendicular to the surface of the second ferromagnetic metal layer, and is connected to the second ferromagnetic metal layer, wherein the spin resistance of a connection portion of the spin-orbit torque wiring that is connected to the second (Continued)

ferromagnetic metal layer is larger than the spin resistance of the second ferromagnetic metal layer.

22 Claims, 10 Drawing Sheets

(30) Foreign Application Priority Data

| Mar. 18, 2016 | (JP) | 2016-056058 |
|---|---|---|
| Oct. 27, 2016 | (JP) | 2016-210531 |
| Oct. 27, 2016 | (JP) | 2016-210533 |

(51) Int. Cl.

| H01L 43/08 | (2006.01) |
|---|---|
| H01L 27/105 | (2006.01) |
| H01L 29/82 | (2006.01) |
| H03B 15/00 | (2006.01) |
| G11C 11/16 | (2006.01) |
| H01L 27/22 | (2006.01) |
| H01L 43/02 | (2006.01) |
| H01L 43/10 | (2006.01) |
| H01L 43/14 | (2006.01) |
| G01R 33/09 | (2006.01) |
| H01F 10/32 | (2006.01) |

(52) U.S. Cl.
CPC .......... *G11C 11/1675* (2013.01); *H01F 10/32* (2013.01); *H01L 27/105* (2013.01); *H01L 27/222* (2013.01); *H01L 29/82* (2013.01); *H01L 43/02* (2013.01); *H01L 43/08* (2013.01); *H01L 43/10* (2013.01); *H01L 43/14* (2013.01); *H03B 15/00* (2013.01); *H03B 15/006* (2013.01)

(58) Field of Classification Search
USPC ........................................ 257/427, 365, 336
See application file for complete search history.

(56) References Cited

U.S. PATENT DOCUMENTS

| 9,218,864 | B1 | 12/2015 | Yi et al. |
|---|---|---|---|
| 9,864,950 | B2 | 1/2018 | Datta et al. |
| 9,953,692 | B1 | 4/2018 | Mihajlovic et al. |
| 9,979,401 | B2 | 5/2018 | Pan et al. |
| 10,211,394 | B1 | 2/2019 | Inokuchi et al. |
| 10,229,723 | B1 | 3/2019 | Choi et al. |
| 2002/0160234 | A1 | 10/2002 | Sakawaki et al. |
| 2008/0316657 | A1 | 12/2008 | Zhang et al. |
| 2009/0166773 | A1 | 7/2009 | Ohno et al. |
| 2009/0201614 | A1 | 8/2009 | Kudo et al. |
| 2010/0193888 | A1 | 8/2010 | Gu et al. |
| 2010/0227050 | A1 | 9/2010 | Kurokawa |
| 2011/0169112 | A1 | 7/2011 | Chen et al. |
| 2012/0074510 | A1* | 3/2012 | Sasaki ............... G01R 33/093 257/422 |
| 2012/0241883 | A1* | 9/2012 | Sasaki ............... H01L 43/02 257/421 |
| 2012/0250189 | A1 | 10/2012 | Degawa et al. |
| 2013/0114334 | A1 | 5/2013 | Yi et al. |
| 2013/0258524 | A1* | 10/2013 | Sasaki ............... H01L 43/02 360/123.01 |
| 2014/0010004 | A1 | 1/2014 | Suzuki |
| 2014/0056060 | A1 | 2/2014 | Khvalkovskiy et al. |
| 2014/0124882 | A1 | 5/2014 | Khalili Amiri et al. |
| 2014/0269032 | A1 | 9/2014 | Ong et al. |
| 2015/0001601 | A1* | 1/2015 | Koike ............... H01L 43/02 257/295 |
| 2015/0036415 | A1 | 2/2015 | Di Pendina et al. |
| 2015/0041934 | A1 | 2/2015 | Khvalkovskiy et al. |
| 2015/0200003 | A1 | 7/2015 | Buhrman et al. |
| 2015/0213867 | A1 | 7/2015 | Wu et al. |
| 2015/0213869 | A1* | 7/2015 | Wu .................. G11C 11/1693 365/154 |
| 2015/0236247 | A1 | 8/2015 | Behin-Aein et al. |
| 2016/0042778 | A1 | 2/2016 | Manipatruni et al. |
| 2016/0247550 | A1 | 8/2016 | Fukami et al. |
| 2016/0276006 | A1 | 9/2016 | Ralph et al. |
| 2016/0300999 | A1 | 10/2016 | Yi et al. |
| 2016/0380185 | A1 | 12/2016 | Kato et al. |
| 2017/0125078 | A1 | 5/2017 | Mihajlovic et al. |
| 2017/0249990 | A1 | 8/2017 | Bauer et al. |
| 2018/0277746 | A1 | 9/2018 | Abe et al. |

FOREIGN PATENT DOCUMENTS

| JP | 2014179618 A | 9/2014 |
|---|---|---|
| WO | 2013/025994 A2 | 2/2013 |
| WO | 2015/102739 A2 | 7/2015 |
| WO | 2015/137021 A1 | 9/2015 |

OTHER PUBLICATIONS

T. Kimura et al., "Estimation of spin-diffusion length from the magnitude of spin-current absorption: Multiterminal ferromagnetic/nonferromagnetic hybrid structures", Physical Review B72(1), pp. 014461-1-014461-6, 2005.

S. Takahashi et al., "Spin injection and detection in magnetic nanostructures", Physical Review B67(5), pp. 052409-1-052409-4, 2003.

J. Bass et al., "Spin-diffusion lengths in metals and alloys, and spin-flipping at metal/metal interfaces: an experimentalist's critical review", J. Physics Condensed Matter 19, pp. 1-50, 2007.

Y.K. Kato et al., "Observation of the Spin Hall Effect in Semiconductors", Science, 306, pp. 1910-1913, 2004.

L. Liu et al., "Spin torque switching with the giant spin Hall effect of tantalum", Science, vol. 336, pp. 1-18, and vol. 555, pp. 1-12, 2012.

L. Liu et al., "Current-Induced Switching of Perpendicularly Magnetized Magnetic Layers Using Spin Torque from the Spin Hall Effect", Physical Review Letters, 109, pp. 096602-1-096602-5, 2012.

KS. Lee et al., "Threshold current for switching of a perpendicular magnetic layer induced by spin Hall effect", Applied Physics Letters, 102, pp. 112410-1-112410-5, 2013.

KS. Lee et al., "Thermally activated switching of perpendicular magnet by spin-orbit spin torque", Applied Physics Letters, 104, pp. 072413-1-072413-5, 2014.

G. Yu et al, "Switching of perpendicular magnetization by spin-orbit torques in the absence of external magnetic fields", nature nanotechnology, 9, pp. 548-554, 2014.

S. Fukami et al., "Magnetization switching by spin-orbit torque in an antiferromagnet-ferromagnet bilayer system", nature materials, 15, pp. 535-542, 2016.

S. Fukami et al., "A spin-orbit torque switching scheme with collinear magnetic easy axis and current; configuration", nature nanotechnology, 11, pp. 1-6, 2016.

M. Gradhand et al., "Spin Hall angle versus spin diffusion length: Tailored by impurities", Physical Review B, 81, pp. 245109-1-245109-5, 2010.

Feb. 7, 2017 International Search Report issued in Application No. PCT/JP2016/084968.

Feb. 7, 2017 International Search Report issued in Patent Application No. PCT/JP2016/085001.

Feb. 7, 2017 International Search Report issued in Patent Application No. PCT/JP2016/084976.

Feb. 14, 2017 International Search Report issued in Patent Application No. PCT/JP2016/084979.

Feb. 14, 2017 International Search Report issued in Patent Application No. PCT/JP2016/084974.

Feb. 7, 2017 International Search Report issued in Patent Application No. PCT/JP2016/084995.

U.S. Appl. No. 15/777,894, filed May 21, 2018 in the name of Sasaki.

(56) References Cited

OTHER PUBLICATIONS

U.S. Appl. No. 15/778,115, filed May 22, 2018 in the name of Shiokawa et al.
U.S. Appl. No. 15/778,159, filed May 22, 2018 in the name of Sasaki.
U.S. Appl. No. 15/778,174, filed May 22, 2018 in the name of Sasaki.
U.S. Appl. No. 15/778,577, filed May 23, 2018 in the name of Shiokawa et al.
Apr. 10, 2019 Office Action issued in U.S. Appl. No. 15/777,894.
Apr. 26, 2019 Office Action issued in U.S. Appl. No. 15/778,115.
Feb. 26, 2019 Office Action issued in U.S. Appl. No. 15/778,577.
Sep. 18, 2019 Office Action issued in U.S. Appl. No. 15/778,159.

\* cited by examiner

SPIN CURRENT MAGNETIZATION ROTATIONAL ELEMENT, MAGNETORESISTANCE EFFECT ELEMENT AND MAGNETIC MEMORY

TECHNICAL FIELD

The present disclosure relates to a spin current magnetization rotational element, a magnetoresistance effect element, and magnetic memory.

Priority is claimed on Japanese Patent Application No. 2015-232334, filed Nov. 27, 2015, Japanese Patent Application No. 2016-53072, filed Mar. 16, 2016, Japanese Patent Application No. 2016-56058, filed Mar. 18, 2016, Japanese Patent Application No. 2016-210531, filed Oct. 27, 2016, and Japanese Patent Application No. 2016-210533, filed Oct. 27, 2016, the contents of which are incorporated herein by reference.

BACKGROUND ART

Giant magnetoresistance (GMR) elements composed of a multilayer film of ferromagnetic layers and non-magnetic layers, and tunnel magnetoresistance (TMR) elements which use insulating layers (tunnel barrier layers, barrier layers) for the non-magnetic layers are already known. Generally, although TMR elements have a higher element resistance than GMR elements, the magnetoresistance (MR) ratio of TMR elements is larger than the MR ratio of GMR elements. Consequently, TMR elements are attracting much attention as elements for magnetic sensors, high-frequency components, magnetic heads and non-volatile random access memory (MRAM).

Examples of known methods for writing to MRAM include a method in which a magnetic field generated by an electric current is used to perform writing (magnetization rotation), and a method in which a spin transfer torque (STT) generated by passing an electric current through the stacking direction of a magnetoresistance element is used to perform writing (magnetization rotation).

In the method that uses a magnetic field, a problem arises in that when the size of the element is small, writing becomes impossible to perform with the size of the electric current that is able to flow through the fine wires.

In contrast, in the method that uses spin transfer torque (STT), one ferromagnetic layer (the fixed layer or reference layer) causes spin polarization of the current, that current spin is transferred to the magnetization of the other ferromagnetic layer (the free layer or recording layer), and the torque (STT) generated at that time is used to perform writing (magnetization rotation), and this method offers the advantage that as the size of the element decreases, the size of the current required for writing also decreases.

PRIOR ART LITERATURE

Non-Patent Documents

Non-Patent Document 1: I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).
Non-Patent Document 2: T. Kimura, J. Hamrle, and Y. Otani, Phys. Rev. B72(1), 014461 (2005).
Non-Patent Document 3: S. Takahashi and S. Maekawa, Phys. Rev. B67(5), 052409 (2003).
Non-Patent Document 4: J. Bass and W. P. Pratt Jr., J. Phys. Cond. Matt. 19, 183201 (2007).

DISCLOSURE OF INVENTION

Problems to be Solved by the Invention

Magnetization rotation of a TMR element using STT is efficient when considered from an energy efficiency perspective, but the reversal current density required to achieve magnetization rotation is high.

From the viewpoint of achieving a long life for the TMR element, this reversal current density is preferably low. This point is similar for GMR elements.

Accordingly, in both types of magnetoresistance effect elements, namely in both TMR elements and GMR elements, it is desirable to reduce the current density that flows through the magnetoresistance effect element.

In recent years, magnetization rotation using pure spin current generated by spin-orbit interaction has been advocated as a practically applicable method (for example, Non-Patent Document 1). Pure spin current generated by spin-orbit interaction induces spin-orbit torque (SOT), and this SOT can cause magnetization rotation depending on the magnitude of the SOT. A pure spin current is generated when an electron with upward spin and an electron with downward spin flow with the same frequency in opposing orientations, and because the electric charge flows cancel each other out, the resulting electric current is zero. If magnetization rotation can be achieved using only this pure spin current, then because the electric current flowing through the magnetoresistance effect element is zero, the lifespan of the magnetoresistance effect element can be lengthened. Alternatively, it is thought that if STT is also used for magnetization rotation, then by using SOT generated by pure spin current, the electric current used in generating the STT can be reduced by an amount equivalent to the amount of SOT generated by pure spin current, enabling a lengthening of the lifespan of the magnetoresistance effect element to be achieved. It is thought that in those cases where both STT and SOT are used, the greater the proportion of SOT that is used, the more effectively the lifespan of the magnetoresistance effect element can be lengthened.

Research into the use of SOT is really only just beginning, and it is thought that various problems will arise when SOT is used in specific practical applications, but at present, even the types of problems that may arise are not fully understood.

Magnetization rotation using SOT is generated in a structure in which a member (for example, a layer or a film) formed from a material that generates a pure spin current (hereafter also referred to as "the spin current generation member") is connected to a ferromagnetic metal layer having a variable magnetization orientation (a free layer), by generating a pure spin current in the member by passing an electric current through the member, and allowing that pure spin current to diffuse (be injected) into the ferromagnetic metal layer from the connection portion between the member and the ferromagnetic metal layer. At this time, depending on the difference (mismatch) between the spin resistances of the spin current generation member and the ferromagnetic metal layer, the effect of the injected spin current returning from the ferromagnetic metal layer into the spin current generation member is sometimes a concern. This type of backflow spin current does not contribute to rotation of the magnetization in the ferromagnetic metal layer. The present disclosure was discovered by investigating structures which reduce the amount of this type of backflow spin current.

The present disclosure has been developed in light of the above issues, and has an object of providing a magnetoresistance effect element and magnetic memory that utilize magnetization rotation by pure spin current in a state where backflow of the pure spin current from the ferromagnetic metal layer (free layer) into the spin-orbit torque wiring is reduced.

Means for Solving the Problems

In order to achieve the above objects, the present disclosure provides the following aspects.
(1) A spin current magnetization rotational element according to one aspect of the present disclosure includes a second ferromagnetic metal layer having a variable magnetization direction, and spin-orbit torque wiring which extends in a direction that intersects a direction perpendicular to the surface of the second ferromagnetic metal layer, and is connected to the second ferromagnetic metal layer, wherein the spin resistance of a connection portion of the spin-orbit torque wiring that is connected to the second ferromagnetic metal layer is larger than the spin resistance of the second ferromagnetic metal layer.
(2) In the spin current magnetization rotational element according to (1) above, the spin-orbit torque wiring layer may have a spin current generation portion formed from a material that generates a spin current, and a conductive portion, wherein a portion of the spin current generation portion constitutes the connection portion.
(3) In the spin current magnetization rotational element according to (2) above, the electrical resistivity of the conductive portion may be not higher than the electrical resistivity of the spin current generation portion.
(4) In the spin current magnetization rotational element according to (2) or (3) above, the spin current generation portion may be formed from a material selected from the group consisting of tungsten, molybdenum, niobium, and alloys containing at least one of these metals.
(5) In the spin current magnetization rotational element according to any one of (1) to (4) above, the spin-orbit torque wiring may have a side wall connection portion that contacts a portion of a side wall of the second ferromagnetic metal layer.
(6) A magnetoresistance effect element according to one aspect of the present disclosure includes the spin current magnetization rotational element according to any one (1) to (5) above, a first ferromagnetic metal layer having a fixed magnetization orientation, and a non-magnetic layer sandwiched between the first ferromagnetic metal layer and the second ferromagnetic metal layer.
(7) In the magnetoresistance effect element according to (6) above, the first ferromagnetic metal layer may be positioned below the second ferromagnetic metal layer in the stacking direction.
(8) Magnetic memory according to one aspect of the present disclosure contains a plurality of the magnetoresistance effect elements according to (6) or (7) above.

A magnetization rotation method is a method for reversing the magnetization in the magnetoresistance effect element according to (6) or (7) above, wherein the electric current density flowing through the spin-orbit torque wiring is set to less than $1 \times 10^7$ A/cm$^2$.

Effects of the Invention

By using the spin current magnetization rotational element according to the present disclosure, magnetization rotation using pure spin current can be performed in a state where backflow of the pure spin current from the ferromagnetic metal layer (free layer) into the spin-orbit torque wiring is reduced.

EMBODIMENTS FOR CARRYING OUT THE INVENTION

The present disclosure is described below in further detail, with appropriate reference to the drawings. The drawings used in the following description may be drawn with specific portions enlarged as appropriate to facilitate comprehension of the features of the present disclosure, and the dimensional ratios and the like between the constituent elements may differ from the actual values. The materials and dimensions and the like presented in the following descriptions are merely examples, which in no way limit the present disclosure, and may be altered as appropriate within the scope of the present disclosure. The elements of the present disclosure may also include other layers, provided the effects of the present disclosure are retained.

(Spin Current Magnetization Rotational Element)

Figure 1:
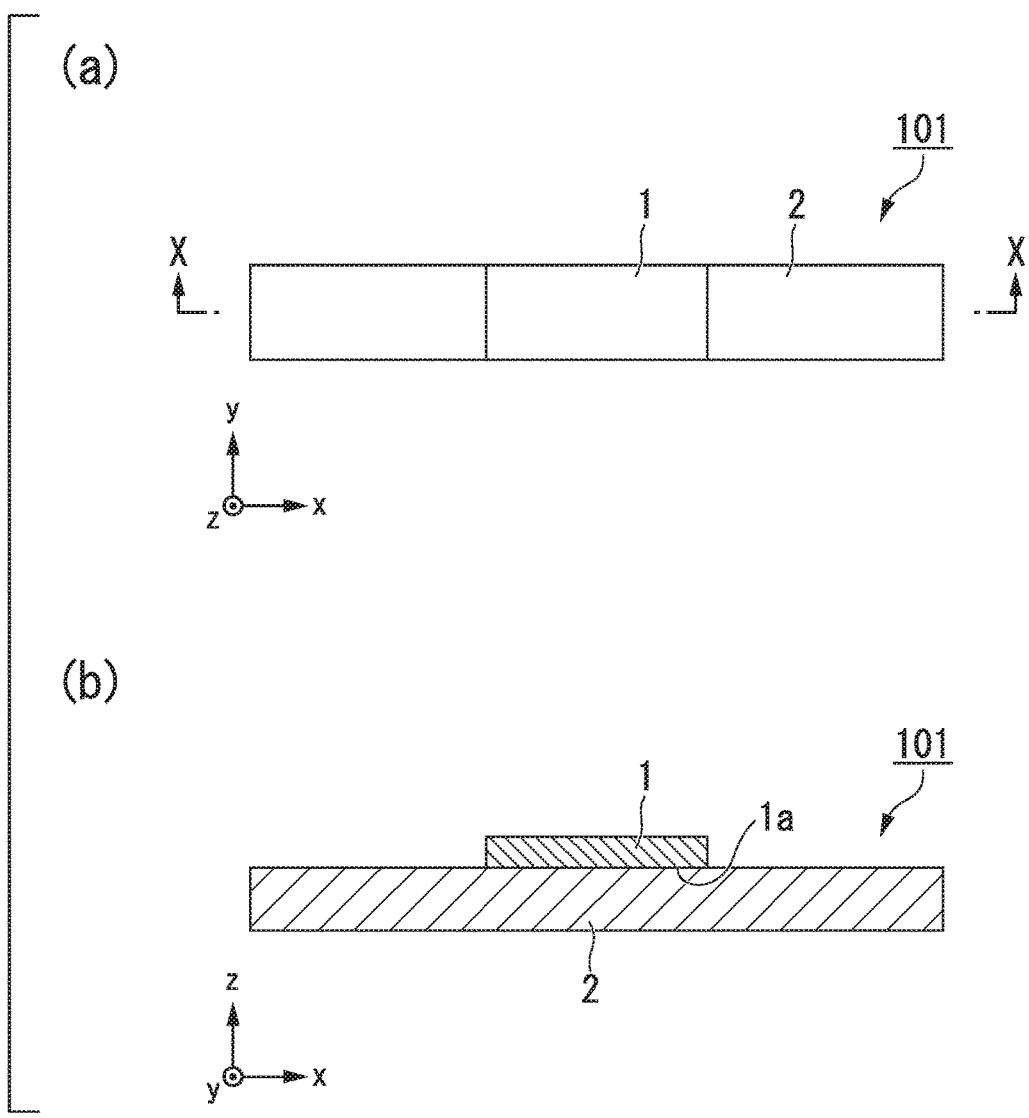
FIG. 1 is schematically view for illustrating a spin current magnetization rotational element according to an embodiment of the present disclosure, wherein (a) is a plan view and (b) is a cross-sectional view.

FIG. 1 is a schematic view of one example of a spin current magnetization rotational element according to an embodiment of the present disclosure. FIG. 1(a) is a plan view, and FIG. 1(b) is a cross-sectional view of a section cut along the line X-X that represents the centerline in the width direction of spin-orbit torque wiring 2 of FIG. 1(a).

In a spin current magnetization rotational element according to one aspect of the present disclosure, a spin current magnetization rotational element 101 illustrated in FIG. 1 has a second ferromagnetic metal layer 1 having a variable magnetization orientation, and spin-orbit torque wiring 2, which extends in a second direction (the x-direction) that intersects a first direction (the z-direction) that is perpendicular to the surface of the second ferromagnetic metal layer 1, and is connected to a first surface 1a of the Second Ferromagnetic metal layer 1, wherein the spin resistance of at least a connection portion of the spin-orbit torque wiring 2 that is connected to the second ferromagnetic metal layer 1 is larger than the spin resistance of the second ferromagnetic metal layer 1.

The connection between the spin-orbit torque wiring 2 and the second ferromagnetic metal layer 1 may be a "direct" connection, or may involve connection "via another layer" such as the cap layer described below, and there are no restrictions on the way in which the spin-orbit torque wiring and the second ferromagnetic metal layer are connected (joined or bonded), provided the pure spin current generated in the spin-orbit torque wiring 2 can flow into the second ferromagnetic metal layer 1.

A ferromagnetic material, and particularly a soft magnetic material, can be used as the material for the second ferromagnetic metal layer 1. Examples of materials that may be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

In those cases where the orientation of the magnetization of the second ferromagnetic metal layer 1 is perpendicular to the stacking surface, the thickness of the second ferromagnetic metal layer is preferably not more than 2.5 nm. In the magnetoresistance effect element described below, perpendicular magnetic anisotropy can be applied to the second ferromagnetic metal layer 1 at the interface between the second ferromagnetic metal layer 1 and a non-magnetic layer 22 (see FIG. 5). Further, because the perpendicular magnetic anisotropy effect is attenuated as the thickness of the second ferromagnetic metal layer 1 is increased, the thickness of the second ferromagnetic metal layer 1 is preferably kept thin.

<Spin-Orbit Torque Wiring>

The spin-orbit torque wiring extends in a direction that intersects a direction perpendicular to the surface of the second ferromagnetic metal layer. The spin-orbit torque wiring is connected electrically to a power supply that supplies an electric current to the spin-orbit torque wiring in a direction orthogonal to a direction perpendicular to the surface of the second ferromagnetic metal layer (namely, in the direction of extension of the spin-orbit torque wiring), and functions, in combination with the power supply, as a spin injection device the injects a pure spin current into the second ferromagnetic metal layer.

The spin-orbit torque wiring is formed from a material that generates a pure spin current by the spin Hall effect when a current flows through the material. This material may have any composition capable of generating a pure spin current in the spin-orbit torque wiring. Accordingly, the material is not limited to materials formed from simple elements, and may also be composed of a portion formed from a material that generates a pure spin current and a portion formed from a material that does not generate a pure spin current.

The spin Hall effect is a phenomenon wherein when an electric current is passed through a material, a pure spin current is induced in a direction orthogonal to the orientation of the electric current as a result of spin-orbit interactions.

Figure 2:
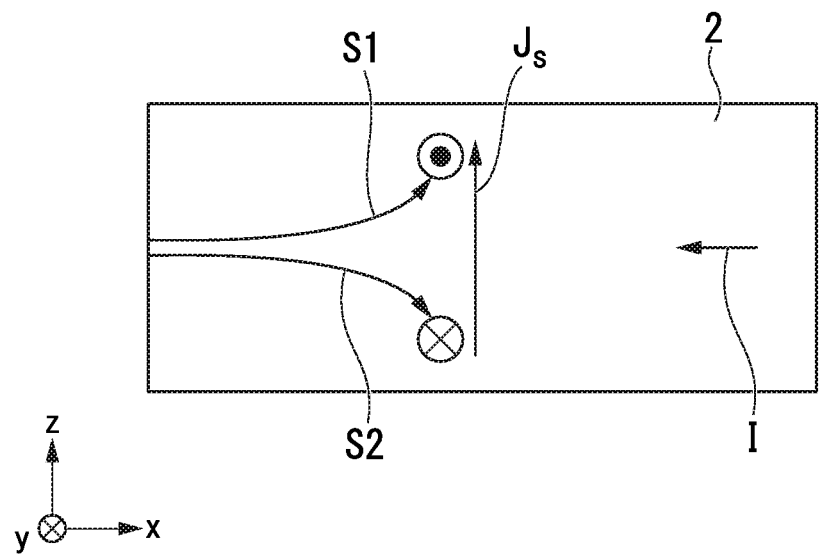
FIG. 2 is a schematic view for describing the spin Hall effect.

FIG. 2 is a schematic view for describing the spin Hall effect. The mechanism by which a pure spin current is generated by the spin Hall effect is described below based on FIG. 2.

As illustrated in FIG. 2, when an electric current I is passed along the direction of extension of the spin-orbit torque wiring 2, an upward-directed spin $S^+$ (S1) and a downward-directed spin $S^-$ (S2) are each bent in directions orthogonal to the electric current. The normal Hall effect and the spin Hall effect have in common the fact that the direction of travel (movement) of the traveling (moving) electric charge (electrons) is bent, but differ significantly in terms of the fact that in the common Hall effect, charged particles traveling through a magnetic field are affected by Lorentz forces, resulting in a bending of the travel direction, whereas in the spin Hall effect, despite no magnetic field existing, the travel direction bends simply under the effect of the movement of the electrons (flow of current).

In a non-magnetic material (a material that is not ferromagnetic), the electron count of the upward-directed spin $S^+$ and the electron count of the downward-directed spin $S^-$ are equal, and therefore in FIG. 2, the electron count of the upward-directed spin $S^+$ that is heading in the upward direction and the electron count of the downward-directed spin $S^-$ that is heading in the downward direction are equal. Accordingly, the electric current represented by the net flux of the electric charge is zero. This type of spin current that is not accompanied by an electric current is called a pure spin current.

In contrast, when an electric current is passed through a ferromagnetic material, the fact that the upward-directed spin electrons and the downward-directed spin electrons are bent in opposite directions is the same as above. However, the difference in a ferromagnetic material is that one of either the upward-directed spin electrons or the downward-directed spin electrons are more numerous, resulting in the occurrence of a net flux for the electric charge (and the generation of a voltage). Accordingly, a material formed solely from a ferromagnetic substance cannot be used as the material for the spin-orbit torque wiring.

If the electron flow of the upward-directed spin $S^+$ is represented by $J_\uparrow$, the electron flow of the downward-directed spin $S^-$ is represented by and the spin current is represented by $J_S$, then the spin current is defined as $J_S = J_\uparrow - J_\downarrow$. In FIG. 2, the pure spin current $J_S$ flows in the upward direction in the figure. Here, $J_S$ is an electron flow having 100% polarizability.

In FIG. 2, when a ferromagnetic material is brought into contact with the upper surface of the spin-orbit torque wiring 2, the pure spin current diffuses and flows into the ferromagnetic material.

In the present disclosure, by employing a structure in which an electric current is passed through the spin-orbit torque wiring in this manner to generate a pure spin current, and that pure spin current then diffuses into the second ferromagnetic metal layer that contacts the spin-orbit torque wiring, the spin-orbit torque (SOT) effect generated by this pure spin current is able to contribute to magnetization rotation of the second ferromagnetic metal layer that represents the free layer.

The magnetoresistance effect element of the present disclosure described below, namely a magnetoresistance effect element in which the SOT effect generated by pure spin current is used to achieve magnetization rotation of a ferromagnetic metal layer, can be used as an assist element that uses the SOT effect generated by the pure spin current to assist magnetization rotation that utilizes conventional STT, or as the main element for performing magnetization rotation using the SOT effect generated by the pure spin current with assistance from magnetization rotation using conventional STT, or can also be used as a novel magnetoresistance effect element in which magnetization rotation of the ferromagnetic metal layer is conducted solely by the SOT generated by the pure spin current.

Examples of known methods for assisting magnetization rotation include methods in which an external magnetic field is applied, methods in which a voltage is applied, methods in which heating is included, and methods that utilize strain in a substance. However, in the case of methods in which an external magnetic field is applied, methods in which a voltage is applied, and methods in which heating is included, additional external wiring and heat sources and the like must be provided, thereby increasing the complexity of the element structure. Further, in the case of methods that utilize strain in a substance, once the strain has been generated, controlling that strain during use is difficult, and achieving magnetization rotation with good control is impossible.

In the spin current magnetization rotational element of the present disclosure, the spin resistance of at least the connection portion of the spin-orbit torque wiring that is connected to the second ferromagnetic metal layer is larger than the spin resistance of the second ferromagnetic metal layer. By using such a structure, when spin current diffuses from the spin-orbit torque wiring and is injected into the second ferromagnetic metal layer, return of the spin current from the second ferromagnetic metal layer back into the spin-orbit torque wiring is reduced.

(Spin Resistance, Spin Resistivity)

The spin resistance is a value that quantitatively indicates the ease of spin flow (the difficulty of spin relaxation). Non-Patent Document 2 describes a theoretical treatment of spin resistance. At an interface between substances having different spin resistance, reflection (return) of the spin flow can occur. In other words, only a portion of the spin current is injected from a material having a small spin resistance into a material having a large spin resistance.

The spin resistance $R_S$ is defined by the formula below (see Non-Patent Document 3).

[Numerical formula 1]

$$R_s \equiv \frac{\rho \lambda}{A} \quad (1)$$

In the formula, $\lambda$, represents the spin diffusion length of the material, $\rho$ represents the electrical resistivity of the material, and A represents the cross-sectional area of the material.

In a non-magnetic material, if the cross-sectional area is constant, then within the formula (1), the value of $\rho\lambda$, which represents the spin resistivity, determines the size of the spin resistance.

Accordingly, in the spin current magnetization rotational element of the present disclosure, if the size of the spin-orbit torque wiring is constant, then using a material having a large spin resistivity has a greater effect in reducing backflow of the spin current.

In the spin current magnetization rotational element of the present disclosure, in those cases where the second ferromagnetic metal layer is formed from iron (Fe) or an iron-based alloy, the spin resistance of at least the connection portion of the spin-orbit torque wiring layer that is connected to the second ferromagnetic metal layer is larger than the spin resistance of the iron (Fe) or iron-based alloy. By using such a structure, backflow of the spin current from the second ferromagnetic metal layer back into the spin-orbit torque wiring can be reduced.

In the spin current magnetization rotational element of the present disclosure, from the viewpoint of reducing backflow of the spin current from the second ferromagnetic metal layer into the spin-orbit torque wiring, the spin resistivity of the material that constitutes at least the connection portion of the spin-orbit torque wiring layer that is connected to the second ferromagnetic metal layer is preferably as large as possible.

Materials having a large effect in reducing backflow of the spin current from the second ferromagnetic metal layer into the spin-orbit torque wiring should be determined not only on the basis of the spin diffusion length, but also with due consideration of the product of the spin diffusion length and the electrical resistivity.

Table 1 shows the electrical resistivity, the spin diffusion length, and the spin resistivity obtained by multiplying these two values, for a plurality of non-magnetic materials known as pure spin current generation materials, and for the ferromagnetic material iron (Fe). Fe is a typical ferromagnetic material used as a material for the ferromagnetic metal layer in a magnetoresistance effect element.

The electrical resistivity and the spin diffusion length of the non-magnetic materials were calculated using the methods described below, whereas the various parameters for Fe are values based on Non-Patent Document 4.

TABLE 1

| | Material | Resistivity [Ω$\mu$m] | Spin diffusion length @ RT [$\mu$m] | Spin resistivity [Ω$\mu$m$^2$] |
|---|---|---|---|---|
| Ferromagnetic | Fe | 0.04 | 0.0085 | 3.40E−04 |
| Non-magnetic | Pt | 0.0981 | 0.0012 | 1.18E−04 |
| | Pd | 0.1 | 0.0032 | 3.20E−04 |
| | Mo | 0.05 | 0.035 | 1.75E−03 |
| | Nb | 0.152 | 0.0059 | 8.97E−04 |
| | W | 0.049 | 0.036 | 1.76E−03 |
| | $Mo_{0.99}Fe_{0.01}$ | 0.05 | 0.03 | 1.50E−03 |

Of the non-magnetic materials shown in Table 1, it is evident that tungsten (W), molybdenum (Mo), niobium (Nb), and the alloy of Mo and Fe have larger spin resistivity values than the spin resistivity of Fe, and from the viewpoint of reducing the backflow of spin current from the second ferromagnetic metal layer back into the spin-orbit torque wiring, are therefore preferable as the material that constitutes at least the connection portion of the spin-orbit torque wiring layer that is connected to the second ferromagnetic metal layer.

(Spin Diffusion Length)

The spin current depends on the ratio between the distance d and the spin diffusion length $\lambda$, and reduces exponentially in accordance with $\exp(-d/\lambda)$. The spin diffusion length $\lambda$ is a constant that is specific to the material, and is the distance at which the size of the spin current reaches 1/e.

The spin diffusion length of a material can be estimated using various methods. Examples of known methods include non-local methods, methods that utilize the spin pumping effect, and methods that utilize the Hanle effect.

The spin diffusion lengths of the non-magnetic materials shown in Table 1 were obtained by non-local spin valve measurements at room temperature. Details of the measurement method are described below.

In a non-local measurement using a lateral spin valve structure (where the interface between the ferromagnetic material and the non-magnetic material is not a tunnel junction), solving the diffusion equation reveals that the size $\Delta V$ of the spin output (the non-local spin valve signal) is represented by formula (2) shown below (Non-Patent Document 3).

[Numerical formula 2]

$$\Delta V = \frac{\alpha_F^2 Q^2 R_{SN}}{2e^{\frac{d}{\lambda_N}} Q(2+Q) + 4 \sinh(d/\lambda_N)}. \quad (2)$$

In the formula, Q is defined as $Q=R_{SF}/R_{SN}$, wherein $R_{SN}$ and $R_{SF}$ represent the spin resistance values of the non-magnetic material and the ferromagnetic material respectively, defined as $R_{SN}=\lambda_N/(A_N\sigma_N)$ and $R_{SF}=\lambda_F/\{(1-\sigma_F^2)(A_F\sigma_F)\}$, $\lambda_N$ and $\lambda_F$ represent the spin diffusion lengths of the non-magnetic material and the ferromagnetic material respectively, $A_N$ and $A_F$ represent the cross-sectional areas of the regions through which the spin current flows in the non-magnetic material and the ferromagnetic material respectively, $\sigma_N$ and $\sigma_F$ represent the electrical resistivity values of the non-magnetic material and the ferromagnetic material respectively, $\alpha_F$ represents the spin polarization of the ferromagnetic material, and d represents the distance between the two ferromagnetic fine wires.

Figure 3:
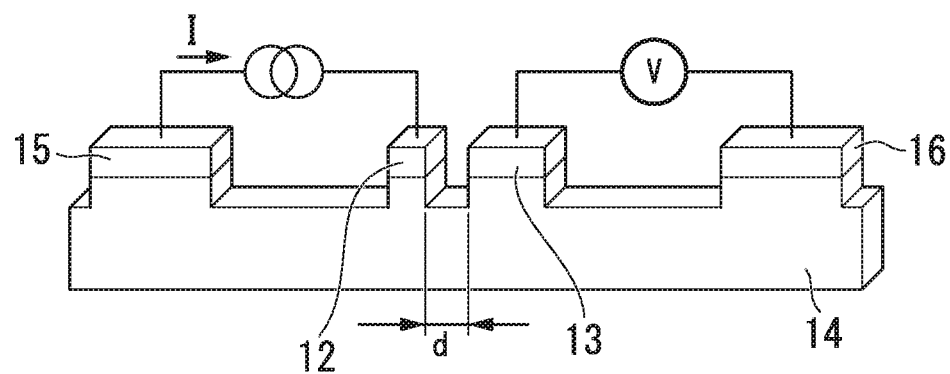
FIG. 3 is a perspective view for describing non-local measurement using a lateral spin valve structure.

As illustrated in FIG. 3, a lateral spin valve structure has a structure in which two ferromagnetic fine wires 12 and 13 disposed with a separation therebetween are linked by a single non-magnetic fine wire 14.

A direct electric current is applied between one ferromagnetic fine wire 12 and a reference electrode 15, and the voltage is measured between the other ferromagnetic fine wire 13 and a reference electrode 16. At this point, a magnetic field is applied, and the magnetizations of the two ferromagnetic fine wires are reversed. Because the shapes (sizes) of the elements differ, a shape anisotropy effect causes variation in the reversed magnetic field, and therefore depending on the region of the magnetic field, the magnetization orientation of the ferromagnetic fine wires can be formed in parallel or in antiparallel. The spin output resistance can be determined from the difference in voltage between the parallel case and the antiparallel case.

Measurements were performed for at least five values for the ferromagnetic fine wire separation distance d within a range from 7 nm to 1 μm. In order to improve the accuracy, it is necessary to determine the number of ferromagnetic fine wire separation distance values d in accordance with the size of the spin diffusion length. In a non-local measurement, if the ferromagnetic fine wire separation distance d is too small, then the amount of noise increases, and therefore the distance cannot be made too small. Accordingly, when the spin diffusion length is small, measurement tends to be performed at the tail of the exponential function, but if the number of measurement points, namely the number of ferromagnetic fine wire separation distance values d, is increased, the measurement accuracy can be improved.

By plotting the ferromagnetic fine wire separation distance along the horizontal axis and the spin output $\Delta V$ along the vertical axis, and then performing fitting using the formula (2), the spin diffusion length of each of the non-magnetic materials was determined.

In the case of the Mo, W and MoFe alloy in Table 1, the ferromagnetic fine wire separation distance d was increased in 5 nm intervals from 25 nm, and 5 measurements were performed. Further, in the case of Nb, the ferromagnetic fine wire separation distance d was increased in 1 nm intervals from 7 nm, and 20 measurements were performed. Further, in the case of Pd, the ferromagnetic fine wire separation distance d was increased in 1 nm intervals from 7 nm, and 40 measurements were performed. Furthermore, in the case of Pt, the ferromagnetic fine wire separation distance d was increased in 1 nm intervals from 7 nm, and 100 measurements were performed. Limitations of the production apparatus mean that resolutions better than 7 nm could not be achieved. The above changes in the ferromagnetic fine wire separation distance d represent design values. However, by measuring a suitably large number of measurement points, any error between the design values and the actual values can be statistically compensated.

In the case of materials such as Pt and Pd, for which the spin diffusion length is short, measurement can usually be performed by a method that utilizes the spin pumping effect or a method that utilizes the Hanle effect.

In the measurements described above, a structure not having a tunnel insulating film at the interface between the ferromagnetic material and the non-magnetic material was used, but a structure having a tunnel insulating film may also be used. For example, by using a film formed from MgO as a tunnel insulating film, a larger output $\Delta V$ can be obtained as a result of coherent tunneling.

(Electrical Resistivity)

Figure 4:
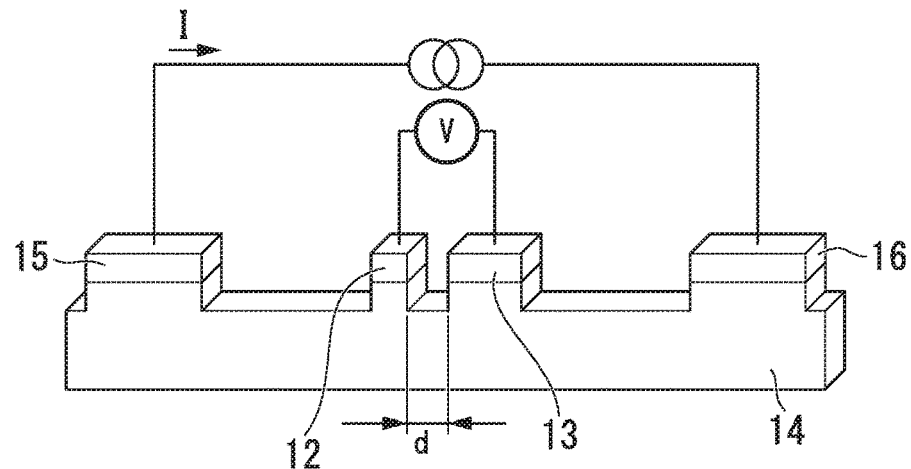
FIG. 4 is a perspective view for describing the measurement of electrical resistivity using the four-terminal method.

As illustrated in FIG. 4, the electrical resistivity was measured using a typical four-terminal method. A direct electric current was applied between the reference electrodes, and the reduction in the voltage between the ferromagnetic fine wires was measured. Further, in order to avoid element fluctuations and errors, the electrical resistivity of the non-magnetic fine wire was determined from a plurality of results for elements having different separation distances between the ferromagnetic fine wires. Specifically, the separation distance between the ferromagnetic fine wires was plotted along the horizontal axis and the electrical resistance was plotted along the vertical axis, and the electrical resistivity was determined from the slope of the plot.

In the case of the Mo and W in Table 1, measurements were performed for five values for the ferromagnetic fine wire separation distance d. In the case of Nb, measurements were performed for 20 values for the ferromagnetic fine wire separation distance d. Further, in the case of Pd, measurements were performed for 40 values for the ferromagnetic fine wire separation distance d. Furthermore, in the case of Pt, measurements were performed for 100 values for the ferromagnetic fine wire separation distance d.

Materials that can be used for forming the spin-orbit torque wiring are described below, under the premise that the spin resistance of at least the connection portion of the spin-orbit torque wiring layer that is connected to the second ferromagnetic metal layer is larger than the spin resistance of the second ferromagnetic metal layer.

The spin-orbit torque wiring may contain a non-magnetic heavy metal. Here, the term "heavy metal" is used to mean a metal having a specific gravity at least as large as that of yttrium. The spin-orbit torque wiring may also be formed solely from a non-magnetic heavy metal.

In such a case, the non-magnetic heavy metal is preferably a non-magnetic metal with a large atomic number of 39 or greater having d-electrons or f-electrons in the outermost shell. The reason for this preference is that such non-magnetic metals exhibit large spin-orbit interactions that generate a spin Hall effect. The spin-orbit torque wiring 2 may also be formed solely from a non-magnetic metal with a large atomic number of 39 or greater and having d-electrons or f-electrons in the outermost shell.

Typically, when an electric current is passed through a metal, all of the electrons move in the opposite direction from the current regardless of spin orientation, but in the case of a non-magnetic metal with a large atomic number having d-electrons or f-electrons in the outermost shell, because the spin-orbit interactions are large, the spin Hall effect means that the direction of electron movement is dependent on the electron spin orientation, meaning a pure spin current $J_S$ develops more readily.

Furthermore, the spin-orbit torque wiring may contain a magnetic metal. The term "magnetic metal" means a ferromagnetic metal or an antiferromagnetic metal. By including a trace amount of a magnetic metal in the non-magnetic metal, the spin-orbit interactions can be amplified, thereby increasing the spin current generation efficiency of the electric current passed through the spin-orbit torque wiring. The spin-orbit torque wiring may also be formed solely from an antiferromagnetic metal.

Because spin-orbit interactions occur within interior locations peculiar to the substance of the spin-orbit torque wiring material, pure spin currents also develop in non-magnetic materials. If a trace amount of a magnetic metal is added to the spin-orbit torque wiring material, then because the magnetic metal itself scatters the flowing electron spin, the efficiency of spin current generation is enhanced. However, if the amount added of the magnetic metal is too large, then the generated pure spin current tends to be scattered by the added magnetic metal, resulting in a strengthening of the action reducing the spin current. Accordingly, it is preferable that the molar fraction of the added magnetic metal is considerably lower than the molar fraction of the main component of the pure spin current generation portion in the spin-orbit torque wiring. As a guide, the molar fraction of the added magnetic metal is preferably not more than 3%.

Furthermore, the spin-orbit torque wiring may contain a topological insulator. The spin-orbit torque wiring may also be formed solely from a topological insulator. A topological insulator is a substance in which the interior of the substance is an insulator or high-resistance body, but the surface of the substance forms a metal-like state with spin polarization. Some substances have a type of internal magnetic field known as a spin-orbit interaction. Accordingly, even if an external magnetic field does not exist, the effect of these spin-orbit interactions generates a new topological phase. This is a topological insulator, which as a result of strong spin-orbit interactions and the break of inversion symmetry at the edges, is able to generate a pure spin current with good efficiency.

Examples of preferred topological insulators include SnTe, $Bi_{1.5}Sb_{0.5}Te_{1.7}Se_{1.3}$, $TlBiSe_2$, $Bi_2Te_3$ and $(Bi_{1-x}Sb_x)_2Te_3$. These topological insulators can generate spin current with good efficiency.

The following description includes mainly examples in which the spin current magnetization rotational element of the present disclosure is applied to magnetoresistance effect elements. However, applications of the spin current magnetization rotational element are not limited to magnetoresistance effect elements, and the spin current magnetization rotational element can also be used in other applications. For example, the spin current magnetization rotational element can also be used in a spatial light modulator, by installing a spin current magnetization rotational element in each pixel and using the magneto-optical effect to spatially modulate the incident light, or alternatively, in order to avoid the hysteresis effect caused by the coercive force of the magnet in a magnetic sensor, the magnetic field applied to the easy axis of magnetization of the magnet can be replaced with a spin current magnetization rotational element.

(Magnetoresistance Effect Element)

Figure 5:
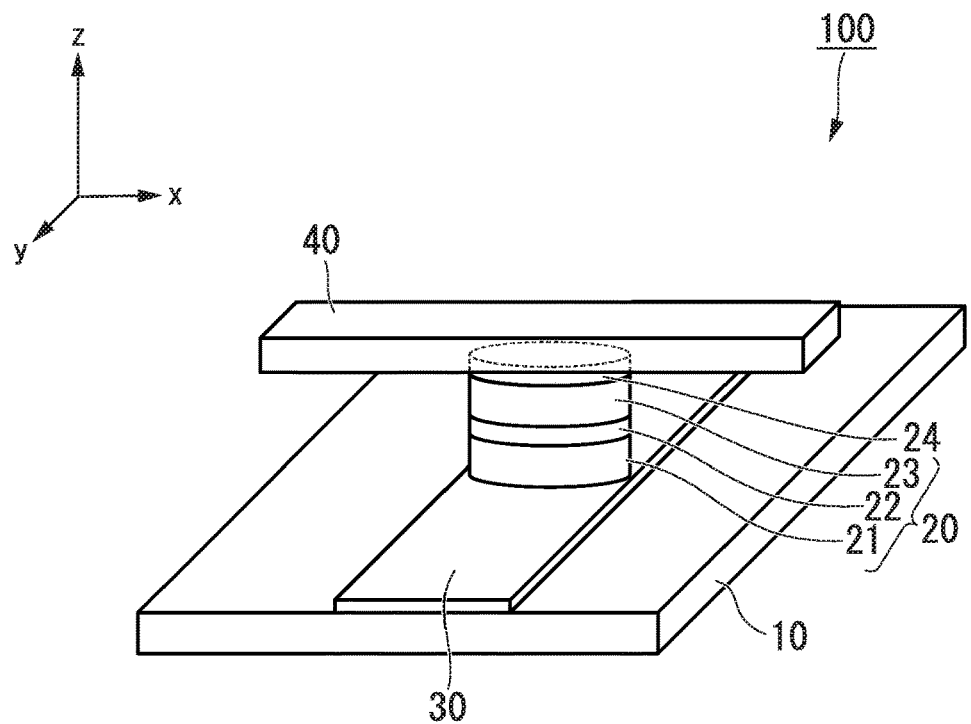
FIG. 5 is a perspective view schematically illustrating a magnetoresistance effect element according to an embodiment of the present disclosure.

FIG. 5 represents an example of an application of the spin current magnetization rotational element of the present disclosure, and is a perspective view schematically illustrating a magnetoresistance effect element according to one embodiment of the present disclosure.

A magnetoresistance effect element 100 according to one embodiment of the present disclosure has a magnetoresistance effect element portion 20, and spin-orbit torque wiring 40 which extends in a direction that intersects the stacking direction of the magnetoresistance effect element portion 20, and is connected to the magnetoresistance effect element portion 20 (a second ferromagnetic metal layer 23), wherein the spin resistance of at least the connection portion of the spin-orbit torque wiring layer that is connected to the second ferromagnetic metal layer is larger than the spin resistance of the second ferromagnetic metal layer. This magnetoresistance effect element 100 according to one embodiment of the present disclosure can also be described as having the spin current magnetization rotational element 101 of the present disclosure, a first ferromagnetic metal layer 21 having a fixed magnetization orientation, and a non-magnetic layer 22.

In the following description, and in FIG. 5, the case in which the spin-orbit torque wiring extends in a direction orthogonal to the stacking direction of the magnetoresistance effect element is described as one example of the structure in which the spin-orbit torque wiring extends in a direction that intersects the stacking direction of the magnetoresistance effect element.

In FIG. 5, wiring 30 for supplying an electric current in the stacking direction of the magnetoresistance effect element portion 20, a substrate 10 for forming that wiring 30, and a cap layer 24 are also shown.

In the following description, the stacking direction of the magnetoresistance effect element portion 20 is deemed the z-direction, the direction perpendicular to the z-direction and parallel with the spin-orbit torque wiring 40 is deemed the x-direction, and the direction orthogonal to the x-direction and the z-direction is deemed the y-direction.

In the example illustrated in FIG. 5, the spin-orbit torque wiring 40 is formed on top of the second ferromagnetic metal layer 23, but may also be formed in the reverse order.

<Magnetoresistance Effect Element Portion>

The magnetoresistance effect element portion 20 has the first ferromagnetic metal layer 21 having a fixed magnetization orientation, the second ferromagnetic metal layer 23 having a variable magnetization orientation, and the non-magnetic layer 22 sandwiched between the first ferromagnetic metal layer 21 and the second ferromagnetic metal layer 23.

The magnetoresistance effect element portion 20 functions by having the magnetization of the first ferromagnetic metal layer 21 fixed in a single direction, while the orientation of the magnetization of the second ferromagnetic metal layer 23 is able to vary relatively. When applied to coercive force difference (pseudo spin valve) MRAM, the coercive force of the first ferromagnetic metal layer is larger than the coercive force of the second ferromagnetic metal layer, whereas when applied to exchange bias (spin valve) MRAM, the magnetization orientation of the first ferromagnetic metal layer is fixed by exchange coupling with an antiferromagnetic layer.

Further, when the non-magnetic layer 22 is formed from an insulator, the magnetoresistance effect element portion 20 is a tunneling magnetoresistance (TMR) element, whereas when the non-magnetic layer 22 is formed from a metal, the magnetoresistance effect element portion 20 is a giant magnetoresistance (GMR) element.

A conventional magnetoresistance effect element portion structure can be used for the magnetoresistance effect element portion included in the present disclosure. For example, each layer may be composed of a plurality of layers, and the structure may also include other layers such as an antiferromagnetic layer for fixing the magnetization orientation of the first ferromagnetic metal layer.

The first ferromagnetic metal layer 21 is also called the fixed layer or reference layer, whereas the second ferromagnetic metal layer 23 is also called the free layer or the memory layer.

The first ferromagnetic metal layer 21 and the second ferromagnetic metal layer 23 may be either in-plane magnetization films in which the magnetization direction is parallel with the in-plane direction, or perpendicular magnetization films in which the magnetization direction is in a direction perpendicular to the layer.

Conventional materials can be used as the material for the first ferromagnetic metal layer 21. For example, metals selected from the group consisting of Cr, Mn, Co, Fe and Ni, and alloys containing at least one of these metals and having ferromagnetism can be used. Further, alloys containing at least one of these metals and at least one element among B, C and N can also be used. Specific examples include Co—Fe and Co—Fe—B.

Further, in order to achieve higher output, a Heusler alloy such as $Co_2FeSi$ is preferably used. Heusler alloys contain intermetallic compounds having a chemical composition of $X_2YZ$, wherein X is a noble metal element or a transition metal element belonging to the Co, Fe, Ni or Cu group of the periodic table, Y is a transition metal belonging to the Mn, V, Cr or Ti group of the periodic table, and the elemental species of X can be used as Y, and Z is a typical element of group III to group V. Specific examples include $Co_2FeSi$, $Co_2MnSi$, and $Co_2Mn_{1-a}Fe_aAl_bSi_{1-b}$.

Furthermore, in order to increase the coercive force of the first ferromagnetic metal layer 21 relative to the second ferromagnetic metal layer 23, an antiferromagnetic material such as IrMn or PtMn may be used as the material that contacts the first ferromagnetic metal layer 21. Moreover, in order to ensure that the leakage magnetic field of the first ferromagnetic metal layer 21 does not affect the second ferromagnetic metal layer 23, a structure having synthetic ferromagnetic coupling may be used.

Furthermore, in those cases where the orientation of the magnetization of the first ferromagnetic metal layer 21 is perpendicular to the stacking surface, a stacked film of Co and Pt is preferably used. Specifically, the structure of the first ferromagnetic metal layer 21 may be [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

Conventional materials can be used for the non-magnetic layer 22.

For example, when the non-magnetic layer 22 is formed from an insulator (and forms a tunnel barrier layer), examples of materials that can be used include $Al_2O_3$, $SiO_2$, MgO and $MgAl_2O_4$. In addition to these materials, materials in which a portion of the Al, Si or Mg has been substituted with Zn or Be or the like can also be used. Among the above materials, MgO and $MgAl_2O_4$ are materials that enable the realization of coherent tunneling, and therefore enable efficient injection of spin.

Further, when the non-magnetic layer 22 is formed from a metal, examples of materials that can be used include Cu, Au, and Ag and the like.

Furthermore, as illustrated in FIG. 5, a cap layer 24 is preferably formed on the surface of the second ferromagnetic metal layer 23 on the opposite side to the non-magnetic layer 22. The cap layer 24 can suppress the diffusion of elements from the second ferromagnetic metal layer 23. Further, the cap layer 24 also contributes to the crystal orientation of each of the layers of the magnetoresistance effect element portion 20. As a result, by providing the cap layer 24, the magnetism of the first ferromagnetic metal layer 21 and the second ferromagnetic metal layer 23 of the magnetoresistance effect element portion 20 can be stabilized, and the resistance of the magnetoresistance effect element portion 20 can be lowered.

A material having high conductivity is preferably used for the cap layer 24. Examples of materials that may be used include Ru, Ta, Cu, Ag and Au. The crystal structure of the cap layer 24 is preferably selected appropriately from among an fcc structure, an hcp structure and a bcc structure, in accordance with the crystal structure of the adjacent ferromagnetic metal layer.

Further, the use of at least one metal selected from the group consisting of silver, copper, magnesium and aluminum for the cap layer 24 is preferred. Details are provided below, but in those cases where the spin-orbit torque wiring 40 and the magnetoresistance effect element portion 20 are connected via the cap layer 24, it is preferable that the cap layer 24 does not dissipate the spin propagated from the spin-orbit torque wiring 40. Silver, copper, magnesium, and aluminum and the like have a long spin diffusion length of at least 100 nm, and are known to be resistant to spin dissipation.

The thickness of the cap layer 24 is preferably not more than the spin diffusion length of the material that constitutes the cap layer 24. Provided the thickness of the cap layer 24 is not more than the spin diffusion length, the spin propagated from the spin-orbit torque wiring 40 can be transmitted satisfactorily to the magnetoresistance effect element portion 20.

<Substrate>

The substrate 10 preferably has superior smoothness. Examples of materials that can be used to obtain a surface having superior smoothness include Si and AlTiC and the like.

A base layer (not shown in the figure) may be formed on the surface of the substrate 10 on the side facing the magnetoresistance effect element portion 20. By providing a base layer, the crystallinity such as the crystal orientation and crystal grain size of each of the layers, including the first ferromagnetic metal layer 21, stacked on top of the substrate 10 can be controlled.

The base layer preferably has insulating properties. This is to prevent dissipation of the electric current flowing through the wiring 30 and the like. Various materials can be used for the base layer.

In one example, a nitride layer having a (001)-oriented NaCl structure and containing at least one element selected from the group consisting of Ti, Zr, Nb, V, Hf, Ta, Mo, W, B, Al and Ce can be used for the base layer.

In another example, a (002)-oriented perovskite-based conductive oxide layer represented by a compositional formula of $XYO_3$ can be used as the base layer. In this formula, site X includes at least one element selected from the group consisting of Sr, Ce, Dy, La, K, Ca, Na, Pb and Ba, and the site Y includes at least one element selected from the group consisting of Ti, V, Cr, Mn, Fe, Co, Ni, Ga, Nb, Mo, Ru, Ir, Ta, Ce and Pb.

In yet another example, an oxide layer having a (001)-oriented NaCl structure and containing at least one element selected from the group consisting of Mg, Al and Ce can be used for the base layer.

In yet another example, a layer having a (001)-oriented tetragonal structure or cubic structure and containing at least one element selected from the group consisting of Al, Cr, Fe, Co, Rh, Pd, Ag, Ir, Pt, Au, Mo and W can be used for the base layer.

Further, the base layer is not limited to a single layer, and a plurality of the layers described in the above examples may be stacked. By appropriate modification of the structure of the base layer, the crystallinity of each layer of the magnetoresistance effect element portion 20 can be enhanced, and the magnetic characteristics can be improved.

<Wiring>

The wiring 30 is connected electrically to the first ferromagnetic metal layer 21 of the magnetoresistance effect element portion 20, and in FIG. 5, the wiring 30, the spin-orbit torque wiring 40 and a power supply (not shown in the figure) form a closed circuit, enabling an electric current to flow through the stacking direction of the magnetoresistance effect element portion 20.

There are no particular limitations on the material for the wiring 30, provided it is a material having high conductivity. For example, aluminum, silver, copper, or gold or the like can be used.

In the following description, the types of structures that can be adopted by the spin-orbit torque wiring are described with reference to FIG. 6 to FIG. 9, under the premise that the spin resistance of at least the connection portion of the spin-orbit torque wiring layer that is connected to the second ferromagnetic metal layer is larger than the spin resistance of the second ferromagnetic metal layer.

FIG. 6 to FIG. 9 are schematic views for describing embodiments of the spin-orbit torque wiring, and in each figure, (a) is a cross-sectional view, and (b) is a plan view.

In the magnetoresistance effect element of the present disclosure, regardless of whether the structure uses only SOT generated by pure spin current to perform magnetization rotation of the magnetoresistance effect element (also referred to as an "SOT only" structure), or whether the structure uses SOT generated by pure spin current in combination with STT in a conventional magnetoresistance effect element that uses STT (also referred to as an "STT and SOT combination" structure), because the electric current passed through the spin-orbit torque wiring is a typical current that is accompanied by an electric charge flow, the current flow generates Joule heat.

The embodiments of the spin-orbit torque wiring illustrated in FIG. 6 to FIG. 9 are examples of structures for reducing the Joule heat generated by the electric current passed through the spin-orbit torque wiring by using structures other than the materials described above.

In an "STT and SOT combination" structure, the electric current used for causing magnetization rotation of the magnetoresistance effect element portion of the present disclosure includes not only the electric current passed directly into the magnetoresistance effect element portion in order to utilize the STT effect (hereafter also referred to as the "STT reversal current"), but also the electric current passed through the spin-orbit torque wiring in order to utilize the SOT effect (hereafter also referred to as the "SOT reversal current"). Because each of these electric currents is a typical current accompanied by an electric charge flow, the flow of these electric currents generates Joule heat.

In this structure, because a combination of magnetization rotation due to the STT effect and magnetization rotation due to the SOT effect is used, the STT reversal current is reduced compared with a structure in which magnetization rotation is performed using only the STT effect, but the energy associated with the SOT reversal current is consumed.

The heavy metal, which is a material that readily generates a pure spin current, has a higher electric resistivity than the types of metals typically used as wiring.

As a result, from the viewpoint of reducing the Joule heat generated by the SOT reversal current, it is preferable that rather than having the entire spin-orbit torque wiring formed solely from a material that can generate a pure spin current, the spin-orbit torque wiring preferably has a portion having low electric resistivity. In other words, from the above viewpoint, the spin-orbit torque wiring is preferably composed of a portion formed from a material that generates a pure spin current (a spin current generation portion), and a conductive portion having a small electrical resistivity. The conductive portion is preferably formed from a material having a smaller electrical resistivity than the spin current generation portion.

The spin current generation portion may be formed from any material capable of generating a pure spin current, and may, for example, have a structure composed of portions of a plurality of different materials.

For the conductive portion, the types of materials typically used as wiring can be used. For example, aluminum, silver, copper, or gold or the like can be used. The conductive portion may be formed from any material having a smaller electrical resistivity than the spin current generation portion, and may have a structure composed of portions of a plurality of different materials.

A pure spin current may also be generated in the conductive portion. In this case, in order to distinguish between the spin current generation portion and the conductive portion, those portions formed from materials listed in the present description as materials for use as the spin current generation portion or the conductive portion can be differentiated as the spin current generation portion or the conductive portion respectively. Furthermore, portions besides the main portion that generates the pure spin current, which have a smaller electrical resistivity than the main portion, can be differentiated from the spin current generation portion as conductive portions.

The spin current generation portion may contain a nonmagnetic heavy metal. In this case, any heavy metal capable of generating a pure spin current may be included. Further, in this case, it is preferable either that the heavy metal capable of generating a pure spin current has a much lower concentration range than the main component of the spin current generation portion, or that the heavy metal capable of generating a pure spin current is the main component, and represents, for example, 90% or more of the spin current generation portion. In this case, the heavy metal capable of generating a pure spin current is preferably composed 100% of a non-magnetic metal with an atomic number of 39 or greater having d-electrons or f-electrons in the outermost shell.

Here, the expression that "the heavy metal capable of generating a pure spin current has a much lower concentration range than the main component of the spin current generation portion" means that, for example, in a spin current generation portion containing copper as the main component, the concentration of the heavy metal represents a molar fraction of 10% or less. In those cases where the main component constituting the spin current generation portion is composed of a metal other than the aforementioned heavy metal, the concentration of the heavy metal within the spin current generation portion is preferably a molar fraction of not more than 50%, and more preferably a molar fraction of 10% or less. These concentration ranges represent ranges that enable the electron spin scattering effect to be obtained effectively. When the concentration of heavy metal is low, a light metal having a smaller atomic number than the heavy metal becomes the main component. In this case, the heavy metal does not form an alloy with the light metal, but rather, it is assumed that atoms of the heavy metal are dispersed in a disorderly manner within the light metal. Because spin-orbit interactions in the light metal are weak, pure spin current is unlikely to be generated by the spin Hall effect. However, when electrons pass the heavy metal within the light metal, a spin scattering effect occurs at the interface between the light metal and the heavy metal, and therefore even when the concentration of the heavy metal is low, a pure spin current can be generated with good efficiency. When the concentration of the heavy metal exceeds 50%, although the proportion of spin Hall effect within the heavy metal increases, the effect at the interface between the light metal and the heavy metal decreases, resulting in a reduction on the overall effect. Accordingly, a heavy metal concentration at which a satisfactory interface effect can be anticipated is preferable.

Further, in those cases where the spin-orbit torque wiring contains a magnetic metal, the spin current generation portion in the spin-orbit torque wiring may be composed of an antiferromagnetic metal. An antiferromagnetic metal can produce a similar effect to the case where the heavy metal is composed 100% of a non-magnetic metal with an atomic number of 39 or greater having d-electrons or f-electrons in the outermost shell. The antiferromagnetic metal is, for example, preferably IrMn or PtMn or the like, and the thermally stable IrMn is particularly preferred.

Further, in those cases where the spin-orbit torque wiring contains a topological insulator, the spin current generation portion in the spin-orbit torque wiring may be composed of the topological insulator. The topological insulator is, for example, SnTe, $Bi_{1.5}Sb_{0.5}Te_{1.7}Se_{1.3}$, $TlBiSe_2$, $Bi_2Te_3$, or $(Bi_{1-x}Sb_x)_2Te_3$ or the like. These topological insulators are capable of generating a spin current with high efficiency.

In order to ensure that the pure spin current generated in the spin-orbit torque wiring diffuses effectively into the magnetoresistance effect element portion, at least a portion of the spin current generation portion must be connected to the second ferromagnetic metal layer. When a cap layer exists, at least a portion of the spin current generation portion must be connected to the cap layer.

In the magnetoresistance effect element of the present disclosure, the spin-orbit torque wiring layer must have a connection portion that is connected to the second ferromagnetic metal layer, but the connection portion that is connected to the second ferromagnetic metal layer may be at least a portion of the spin current generation portion.

The embodiments of spin-orbit torque wiring illustrated in FIG. 6 to FIG. 9 are all structures in which at least a portion of the spin current generation portion is connected to the second ferromagnetic metal layer.

Figure 6:
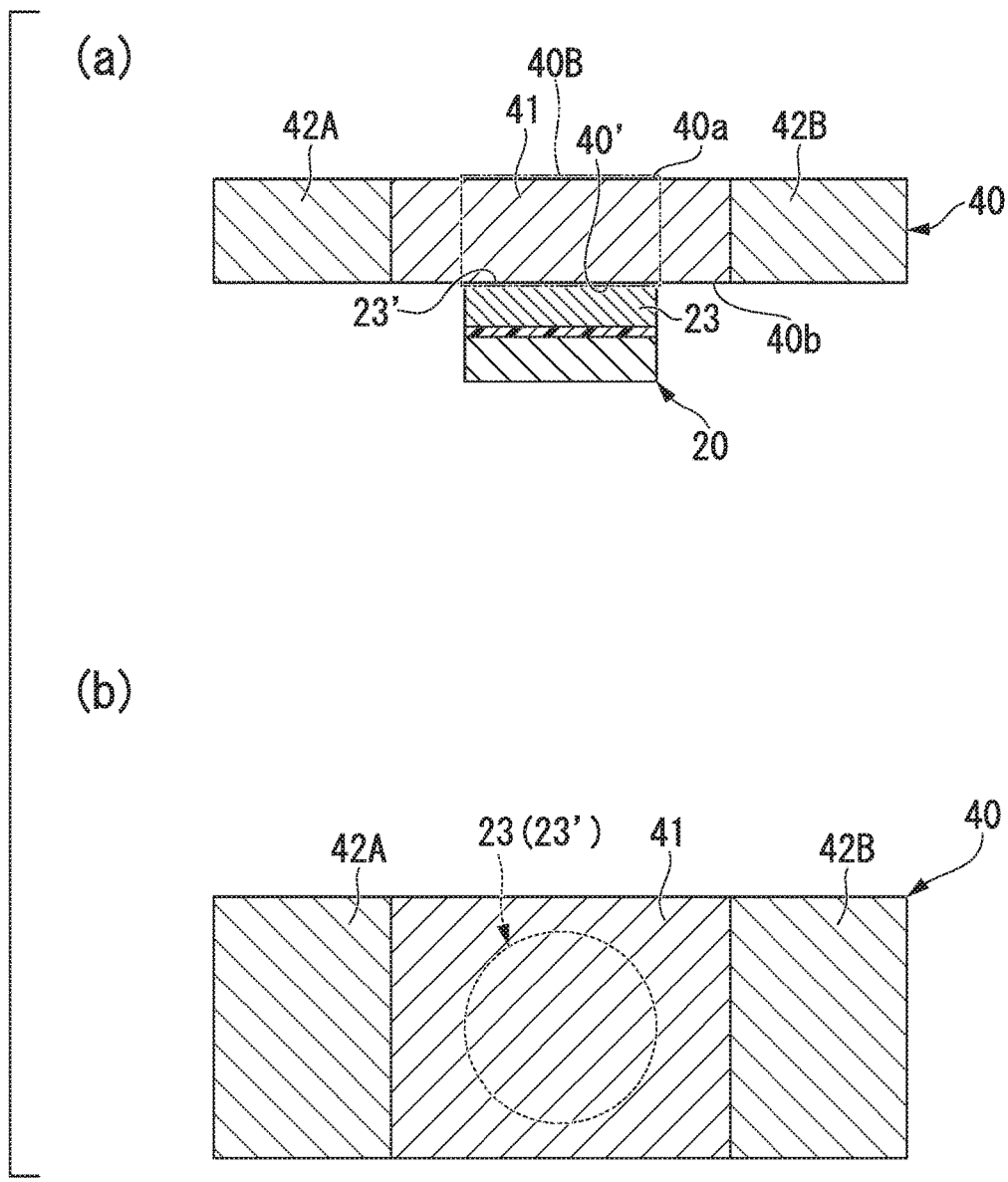
FIG. 6 is a schematic view for describing an embodiment of spin-orbit torque wiring, wherein (a) is a cross-sectional view, and (b) is a plan view.

In the embodiment illustrated in FIG. 6, a connection surface 40' where the spin-orbit torque wiring 40 contacts the second ferromagnetic metal layer 23 is formed entirely from a spin current generation portion 41, and the spin current generation portion 41 is sandwiched between conductive portions 42A and 42B.

The connection portion 40B of the spin-orbit torque wiring 40 that is connected to the second ferromagnetic metal layer 23 is the portion shown by a two-dot chain line in FIG. 6(*a*), and indicates the portion (including the portion in the thickness direction) of the spin-orbit torque wiring that overlaps with the second ferromagnetic metal layer when viewed in plan view from the stacking direction. In other words, the enclosed portion obtained by offsetting a portion of the second ferromagnetic metal layer 23, shown as a plan view projection by the dashed line in FIG. 6(*b*), from one surface 40*a* (see FIG. 6(*a*)) through the thickness direction to the opposing surface 40*b* (see FIG. 6(*a*)), represents the connection portion of the spin-orbit torque wiring. The connection portion 40B where the spin-orbit torque wiring 40 shown in FIG. 6 is connected to the second ferromagnetic metal layer 23 is formed entirely from the spin current generation portion 41. In other words, the connection portion 40B is a portion of the spin current generation portion 41.

The connection between the spin-orbit torque wiring and the second ferromagnetic metal layer may be a "direct" connection, or may involve connection "via another layer" such as the cap layer described below, and there are no restrictions on the way in which the spin-orbit torque wiring and the second ferromagnetic metal layer are connected (joined or bonded), provided the pure spin current generated in the spin-orbit torque wiring can flow into the second ferromagnetic metal layer.

In those cases where the spin current generation portion and the conductive portion are disposed electrically in parallel, the electric current flowing through the spin-orbit torque wiring will flow through the spin current generation portion and the conductive portion in proportions inversely proportional to the sizes of the resistance of the spin current generation portion and the conductive portion.

From the viewpoint of the efficiency of the pure spin current generation relative to the SOT reversal current, in order to ensure that all of the electric current flowing through the spin-orbit torque wiring flows through the spin current generation portion, there must be no portions where the spin current generation portion and the conductive portion are disposed electrically in parallel, and the two portions must be disposed entirely in series.

Figure 7:
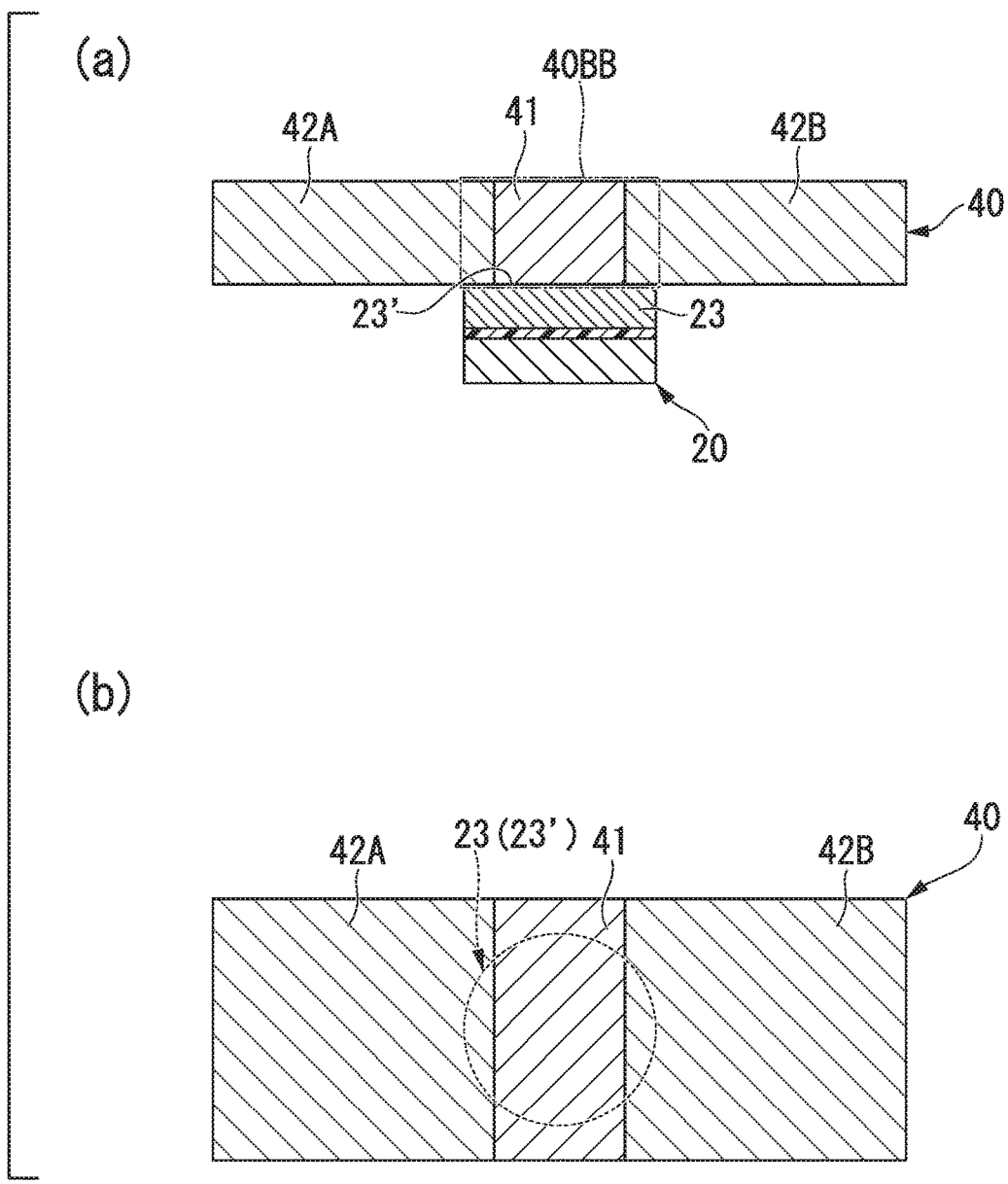
FIG. 7 is a schematic view for describing another embodiment of spin-orbit torque wiring, wherein (a) is a cross-sectional view, and (b) is a plan view.
Figure 8:
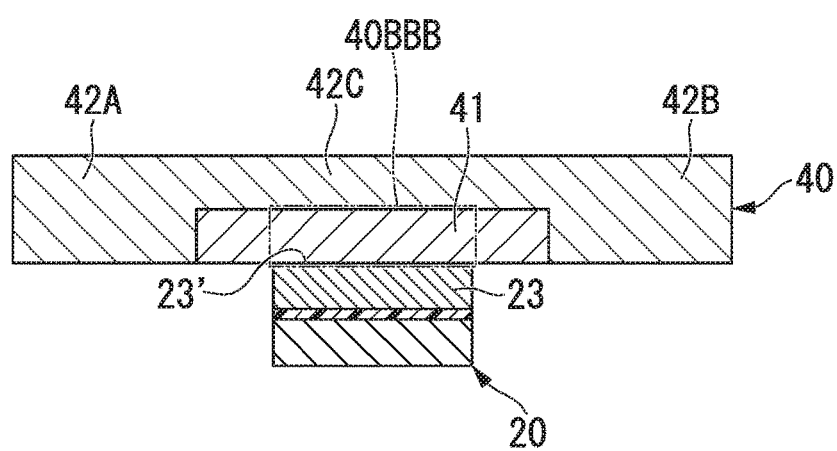
FIG. 8 is a schematic view for describing yet another embodiment of spin-orbit torque wiring, wherein (a) is a cross-sectional view, and (b) is a plan view.
Figure 8:
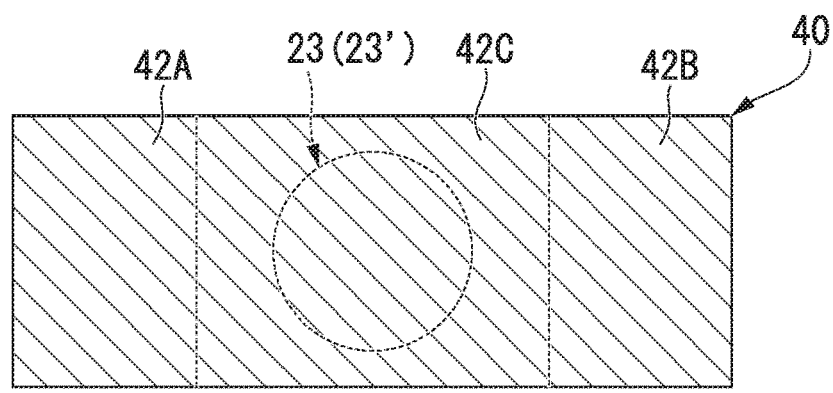
Figure 9:
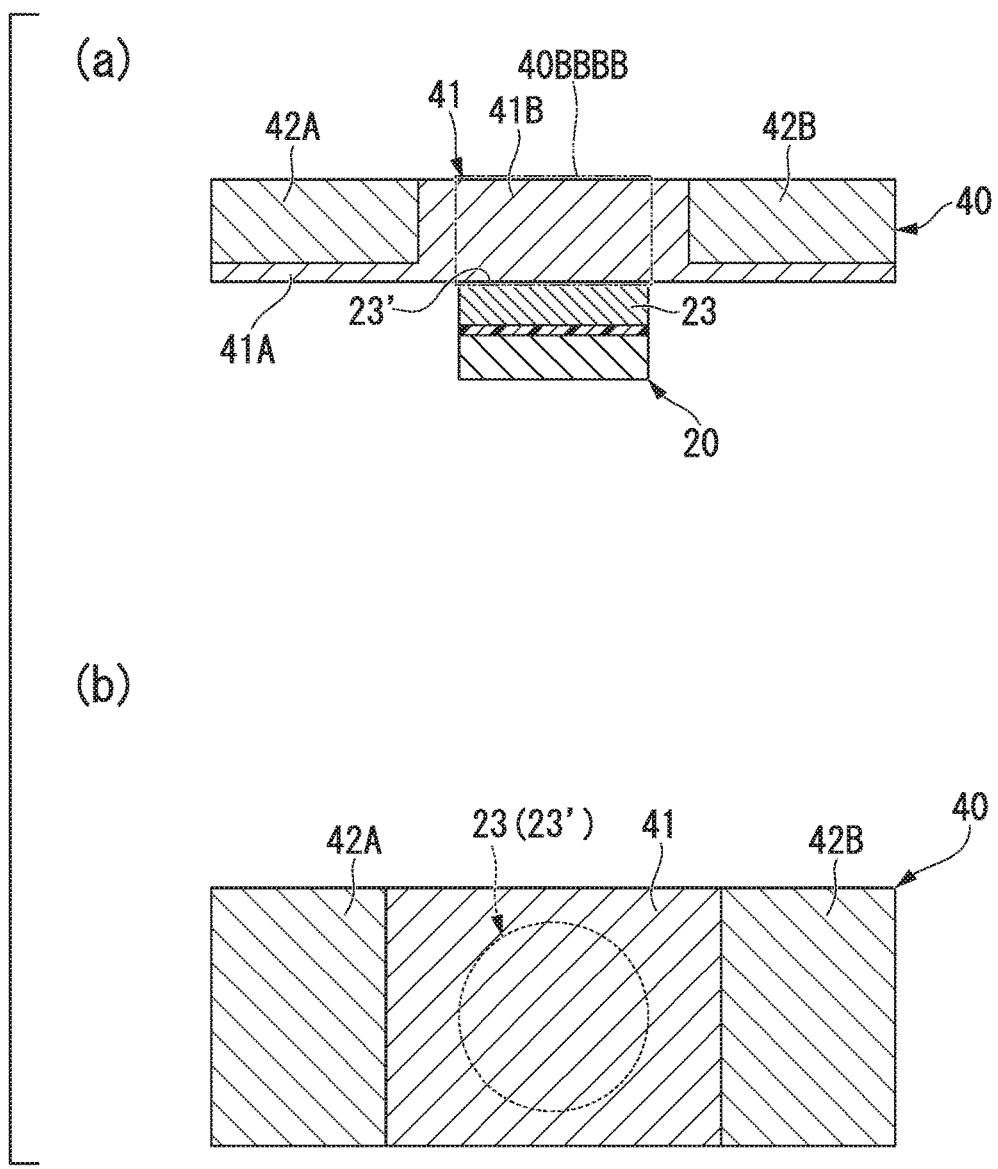
FIG. 9 is a schematic view for describing yet another embodiment of spin-orbit torque wiring, wherein (a) is a cross-sectional view, and (b) is a plan view.

The spin-orbit torque wirings illustrated in FIG. 6 to FIG. 9 are illustrated in plan view from the stacking direction of the magnetoresistance effect element, and represent structures in which there are no portions where the spin current generation portion and the conductive portion are disposed electrically in parallel, and in which the efficiency of the pure spin current generation relative to the SOT reversal current is highest in the structure having the cross-section illustrated in (a) in FIGS. 6, 7, and 9.

The spin-orbit torque wiring 40 illustrated in FIG. 6 has a structure in which the spin current generation portion 41 is superimposed so as to cover all of a connection portion 23' of the second ferromagnetic metal layer 23 when viewed in plan view from the stacking direction of the magnetoresistance effect element portion 20, and the thickness direction of the spin-orbit torque wiring 40 is composed solely of the spin current generation portion 41, with the conductive portions 42A and 42B positioned so as to sandwich the spin current generation portion 41 in the direction of the electric current flow. In a modification of the spin-orbit torque wiring illustrated in FIG. 6, the spin current generation portion may be superimposed so as to overlap the connection portion of the second ferromagnetic metal layer when viewed in plan view from the stacking direction of the magnetoresistance effect element, with the remaining structure the same as the spin-orbit torque wiring illustrated in FIG. 6.

The spin-orbit torque wiring 40 illustrated in FIG. 7 has a structure in which the spin current generation portion 41 is superimposed on a portion of the connection portion 23' of the second ferromagnetic metal layer 23 when viewed in plan view from the stacking direction of the magnetoresistance effect element portion 20, and the thickness direction of the spin-orbit torque wiring 40 is composed solely of the spin current generation portion 41, with the conductive portions 42A and 42B positioned so as to sandwich the spin current generation portion 41 in the direction of the electric current flow.

A connection portion 40BB of the spin-orbit torque wiring 40 that is connected to the second ferromagnetic metal layer 23 is the portion shown by a two-dot chain line in FIG. 7(a), and indicates the portion (including the portion in the thickness direction) of the spin-orbit torque wiring that overlaps with the second ferromagnetic metal layer when viewed in plan view from the stacking direction. The connection portion 40BB where the spin-orbit torque wiring 40 shown in FIG. 7 is connected to the second ferromagnetic metal layer 23 is formed from the entire spin current generation portion 41 and portions of the conductive portions 42A and 42B.

The spin-orbit torque wiring 40 illustrated in FIG. 8 has a structure in which the spin current generation portion 41 is superimposed so as to cover all of the connection portion 23' of the second ferromagnetic metal layer 23 when viewed in plan view from the stacking direction of the magnetoresistance effect element portion 20, but in which the thickness direction of the spin-orbit torque wiring 40 includes the spin current generation portion 41 and a conductive portion 42C stacked in that order from the side of the second ferromagnetic metal layer, with the conductive portions 42A and 42B positioned so as to sandwich, in the direction of the electric current flow, the portion where the spin current generation portion 41 and the conductive portion 42C are stacked. In a modification of the spin-orbit torque wiring illustrated in FIG. 8, the spin current generation portion may be superimposed so as to overlap the connection portion of the second ferromagnetic metal layer when viewed in plan view from the stacking direction of the magnetoresistance effect element, with the remaining structure the same as the spin-orbit torque wiring illustrated in FIG. 8.

A connection portion 40BBB of the spin-orbit torque wiring 40 that is connected to the second ferromagnetic metal layer 23 is the portion shown by a two-dot chain line in FIG. 8(a), and indicates the portion (including the portion in the thickness direction) of the spin-orbit torque wiring that overlaps with the second ferromagnetic metal layer when viewed in plan view from the stacking direction. The connection portion 40BBB where the spin-orbit torque wiring 40 shown in FIG. 8 is connected to the second ferromagnetic metal layer 23 is formed entirely from the spin current generation portion 41. In other words, the connection portion 40BBB is a portion of the spin current generation portion 41.

The spin-orbit torque wiring 40 illustrated in FIG. 9 has a structure composed of a first spin current generation portion 41A in which the spin current generation portion 41 is formed along the entire surface on the side facing the second ferromagnetic metal layer, a second spin current generation portion 41B, which is stacked on top of the first spin current generation portion and superimposed so as to cover all of the connection portion 23' of the second ferromagnetic metal layer 23 when viewed in plan view from the stacking direction of the magnetoresistance effect element portion 20, and in which the thickness direction of the spin-orbit torque wiring 40 is composed solely of the spin current generation portion, and conductive portions 42A and 42B which are positioned so as to sandwich the second spin current generation portion 41B in the direction of the electric current flow. In a modification of the spin-orbit torque wiring illustrated in FIG. 9, the second spin current generation portion may be superimposed so as to overlap the connection portion of the second ferromagnetic metal layer when viewed in plan view from the stacking direction of the magnetoresistance effect element, with the remaining structure the same as the spin-orbit torque wiring illustrated in FIG. 9.

In the structure illustrated in FIG. 9, because the area of contact between the spin current generation portion 41 and the conductive portion 42 is large, the adhesion between the non-magnetic metal having a high atomic number that constitutes the spin current generation portion 41 and the metal that constitutes the conductive portion 42 is superior.

A connection portion 40BBBB of the spin-orbit torque wiring 40 that is connected to the second ferromagnetic metal layer 23 is the portion shown by a two-dot chain line in FIG. 9(a), and indicates the portion (including the portion in the thickness direction) of the spin-orbit torque wiring that overlaps with the second ferromagnetic metal layer when viewed in plan view from the stacking direction. The connection portion 40BBBB where the spin-orbit torque wiring 40 shown in FIG. 9 is connected to the second ferromagnetic metal layer 23 is formed entirely from the spin current generation portion 41. In other words, the connection portion 40BBBB is a portion of the spin current generation portion 41.

The magnetoresistance effect element of the present disclosure can be produced using conventional methods. A method for producing the magnetoresistance effect elements illustrated in FIG. 6 to FIG. 9 is described below.

First, the magnetoresistance effect element portion 20 can be formed, for example, using a magnetron sputtering apparatus. In those cases where the magnetoresistance effect element portion 20 is a TMR element, a tunnel barrier layer is formed on the first ferromagnetic metal layer by first sputtering about 0.4 to 2.0 nm of aluminum and a metal thin film that can form divalent cations of a plurality of non-magnetic elements, and then performing a plasma oxidation or a natural oxidation by oxygen introduction, followed by a heat treatment. Examples of methods that can be used as the deposition method besides magnetron sputtering, include other thin film formation methods such as vapor deposition methods, laser ablation methods and MBE methods.

Following deposition and shape formation of the magnetoresistance effect element portion 20, the spin current generation portion 41 is preferably formed first. This is because forming a structure that is best capable of suppressing scattering of pure spin current from the spin current generation portion 41 to the magnetoresistance effect element portion 20 leads to superior efficiency.

Following deposition and shape formation of the magnetoresistance effect element portion 20, the region surrounding the processed magnetoresistance effect element portion 20 is covered with a resist or the like to form a surface that includes the upper surface of the magnetoresistance effect element portion 20. At this time, the upper surface of the magnetoresistance effect element portion 20 is preferably planarized. By planarizing the surface, spin scattering at the interface between the spin current generation portion 41 and the magnetoresistance effect element portion 20 can be suppressed.

Next, the material for the spin current generation portion 41 is deposited on the planarized upper surface of the magnetoresistance effect element portion 20. This deposition may be performed using sputtering or the like.

Subsequently, a resist or protective film is placed on the region in which the spin current generation portion 41 is to be formed, and the unneeded portions are removed using an ion milling method or reactive ion etching (RIE) method.

Next, the material that constitutes the conductive portion 42 is deposited by sputtering or the like, and the resist or the like is removed to complete formation of the spin-orbit torque wiring 40. When the shape of the spin current generation portion 41 is complex, formation of the resist or protective film and deposition of the spin current generation portion 41 may be performed across a plurality of repetitions.

The spin-orbit torque wiring layer may have a narrow section in at least a section of the portion that is connected to the second ferromagnetic metal layer. This narrow section is a section that has a smaller cross-sectional area when cut through a section orthogonal to the direction of extension (the lengthwise direction) of the spin-orbit torque wiring layer than the other portions of the spin-orbit torque wiring besides the narrow section. The electric current flowing through the spin-orbit torque wiring layer develops a higher current density in this narrow section, resulting in a pure spin current of high density flowing into the second ferromagnetic metal layer.

Figure 10:
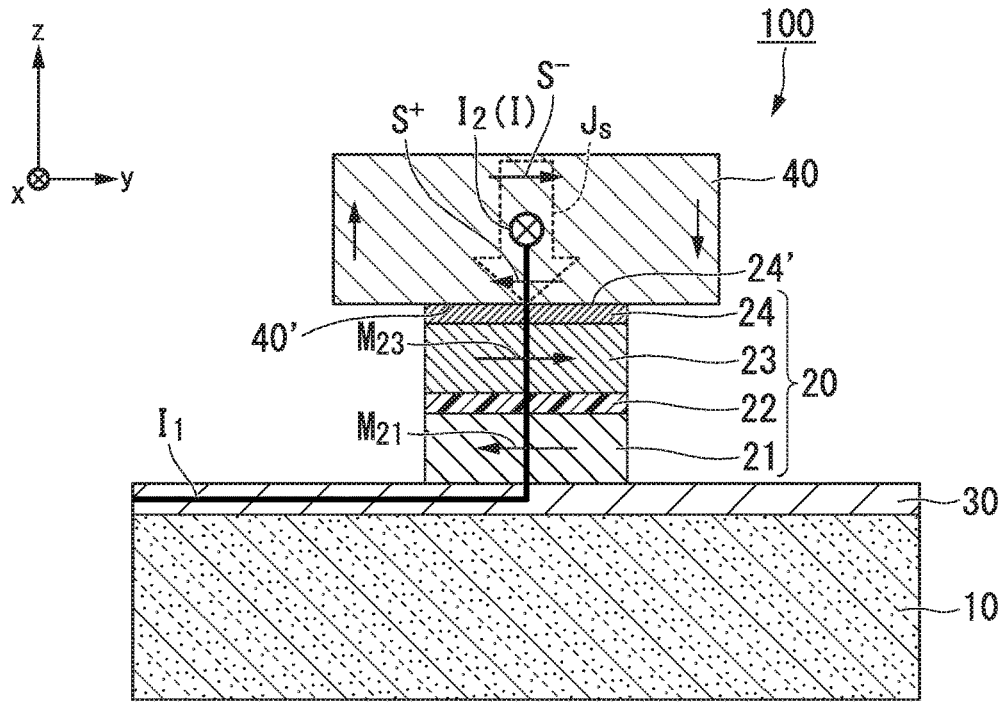
FIG. 10 is a schematic cross-sectional view illustrating a section cut through the yz plane of a magnetoresistance effect element according to an embodiment of the present disclosure.

FIG. 10 is a cross-sectional view illustrating a section cut through the yz plane of a magnetoresistance effect element according to one embodiment of the present disclosure.

The effects for the case when the magnetoresistance effect element 100 is an "STT and SOT combination" structure are described below based on FIG. 10.

As illustrated in FIG. 10, there are two types of electric currents in the magnetoresistance effect element 100. One of these is a current $I_1$ (STT reversal current) that flows through the stacking direction of the magnetoresistance effect element portion 20, and flows though the spin-orbit torque wiring 40 and the wiring 30. In FIG. 10, the current $I_1$ is deemed to flow in order through the spin-orbit torque wiring 40, the magnetoresistance effect element 20, and then the wiring 30. In this case, the electrons flow in order through the wiring 30, the magnetoresistance effect element 20 and then the spin-orbit torque wiring 40.

The other electric current is a current $I_2$ (SOT reversal current) that flows along the direction of extension of the spin-orbit torque wiring 40.

The current $I_1$ and the current $I_2$ mutually intersect (orthogonally), and in the portion where the magnetoresistance effect element 20 is connected to the spin-orbit torque wiring 40 (reference sign 24' indicates the connection portion on the side of the magnetoresistance effect element 20 (the cap layer 24), and the reference sign 40' indicates the connection portion on the side of the spin-orbit torque wiring 40), the current flowing through the magnetoresistance effect element 20 and the current flowing through the spin-orbit torque wiring 40 either merge or are distributed.

By supplying the current $I_1$, electrons having spin oriented in the same direction as the magnetization of the first ferromagnetic metal layer (fixed layer) 21 pass from the first ferromagnetic metal layer (fixed layer) 21 through the non-magnetic layer 22 with the spin orientation maintained, and these electrons act as a torque (STT) that causes the orientation of a magnetization $M_{23}$ of the second ferromagnetic metal layer (free layer) 23 to reverse and adopt an orientation parallel with the orientation of the magnetization $M_{21}$ of the first ferromagnetic metal layer (fixed layer) 21.

On the other hand, the current $I_2$ corresponds with the current I illustrated in FIG. 2. In other words, when the current $I_2$ flows, the upward-directed spin $S^+$ and the downward-directed spin $S^-$ are each bent toward the edges of the spin-orbit torque wiring 40, generating a pure spin current $J_S$. The pure spin current $J_S$ is induced in a direction perpendicular to the direction of flow of the current $I_2$. In other words, pure spin currents $J_S$ are generated in the z-axis direction and the x-axis direction in the figure. In FIG. 10, only the pure spin current $J_S$ in the z-axis direction, which contributes to the orientation of the magnetization of the second ferromagnetic metal layer 23, is shown.

The pure spin current $J_S$ generated by supplying the current $I_2$ to the spin-orbit torque wiring 40 in a direction toward the front of the figure, passes through the cap layer 24 and diffuses into the second ferromagnetic metal layer 23, with this spin affecting the magnetization $M_{23}$ of the second ferromagnetic metal layer 23. In other words, in FIG. 10, a spin oriented in the –x direction flows into the second ferromagnetic metal layer 23, imparting a torque (SOT) that attempts to cause a magnetization rotation of the magnetization $M_{23}$ of the second ferromagnetic metal layer 23 that is oriented in the +x direction.

As described above, the SOT effect due to the pure spin current $J_S$ generated by the electric current flowing along a second current path $I_2$ is added to the STT effect generated by the electric current flowing along a first current path $I_1$, causing a rotation of the magnetization $M_{23}$ of the second ferromagnetic metal layer 23.

If an attempt is made to cause a magnetization rotation of the magnetization of the second ferromagnetic metal layer 23 using only the STT effect (namely, when only the current $I_1$ flows), then a voltage of a prescribed voltage or greater must be applied to the magnetoresistance effect element 20. Although the typical drive voltage for a TMR element is a comparatively small value of several volts or less, because the non-magnetic layer 22 is an extremely thin film of only about several nm, dielectric breakdown can sometimes occur. By continuing current supply to the non-magnetic layer 22, the weak portions of the non-magnetic layer (portions of poor film quality or particularly thin portions) tend to be destroyed.

In contrast, in the case of the "STT and SOT combination" structure of the present disclosure, the magnetoresistance effect element utilizes an SOT effect in addition to the STT effect. As a result, the voltage applied to the magnetoresistance effect element can be reduced, and the current density of the electric current passed through the spin-orbit torque wiring can be reduced. By reducing the voltage applied to the magnetoresistance effect element, the lifespan of the element can be lengthened. Further, by reducing the current density of the electric current passed through the spin-orbit torque wiring, any dramatic reduction in the energy efficiency can be avoided.

The current density of the electric current passed through the spin-orbit torque wiring is preferably less than $1\times10^7$ A/cm$^2$. If the current density of the electric current passed through the spin-orbit torque wiring is too large, then the current flowing through the spin-orbit torque wiring generates heat. If heat is applied to the first ferromagnetic metal layer, then the stability of the magnetization of the first ferromagnetic metal layer tends to deteriorate, and unexpected magnetization rotations or the like can sometimes occur. If this type of unexpected magnetization rotation occurs, then a problem can arise in which recorded information is rewritten. In other words, in order to avoid unexpected magnetization rotation, it is preferable that the current density of the electric current flowing through the spin-orbit torque wiring is prevented from becoming too large. Provided the current density of the electric current flowing through the spin-orbit torque wiring is less than $1\times10^7$ A/cm$^2$, at least magnetization rotations caused by generated heat can be avoided.

Figure 11:
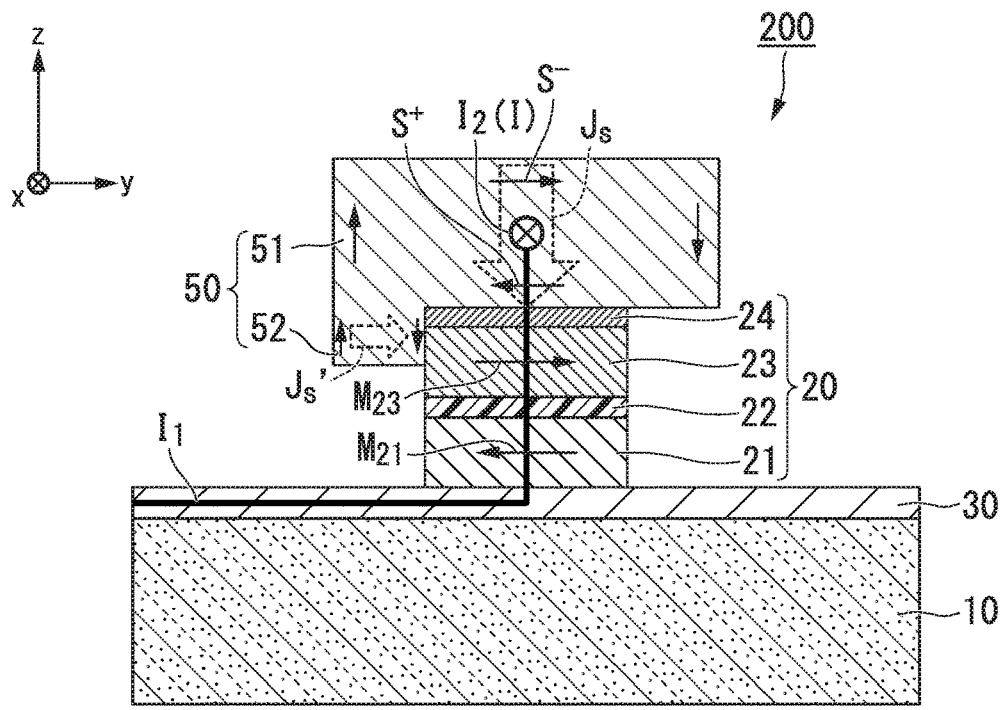
FIG. 11 is a schematic cross-sectional view illustrating a section cut through the yz plane of a magnetoresistance effect element according to another embodiment of the present disclosure.

FIG. 11 illustrates an example of a magnetoresistance effect element having another "STT and SOT combination" structure of the present disclosure.

In the magnetoresistance effect element 200 illustrated in FIG. 11, the spin-orbit torque wiring 50 has an upper surface connection portion 51 provided on top of the magnetoresistance effect element 20 in the stacking direction (equivalent to the spin-orbit torque wiring 40 described above), and also has a side wall connection portion 52 that is connected to the side wall of the second ferromagnetic metal layer 23.

When an electric current is passed through the spin-orbit torque wiring 50, in addition to the pure spin current $J_S$ generated in the upper surface connection portion 51, a pure spin current $J_S'$ is generated in the side wall connection portion 52.

Accordingly, not only does the pure spin current $J_S$ flow from the upper surface of the magnetoresistance effect element 20 through the cap layer 24 and into the second ferromagnetic metal layer 23, but the pure spin current $J_S'$ flows in from the side wall of the second ferromagnetic metal layer 23, meaning the SOT effect is enhanced.

Figure 12:
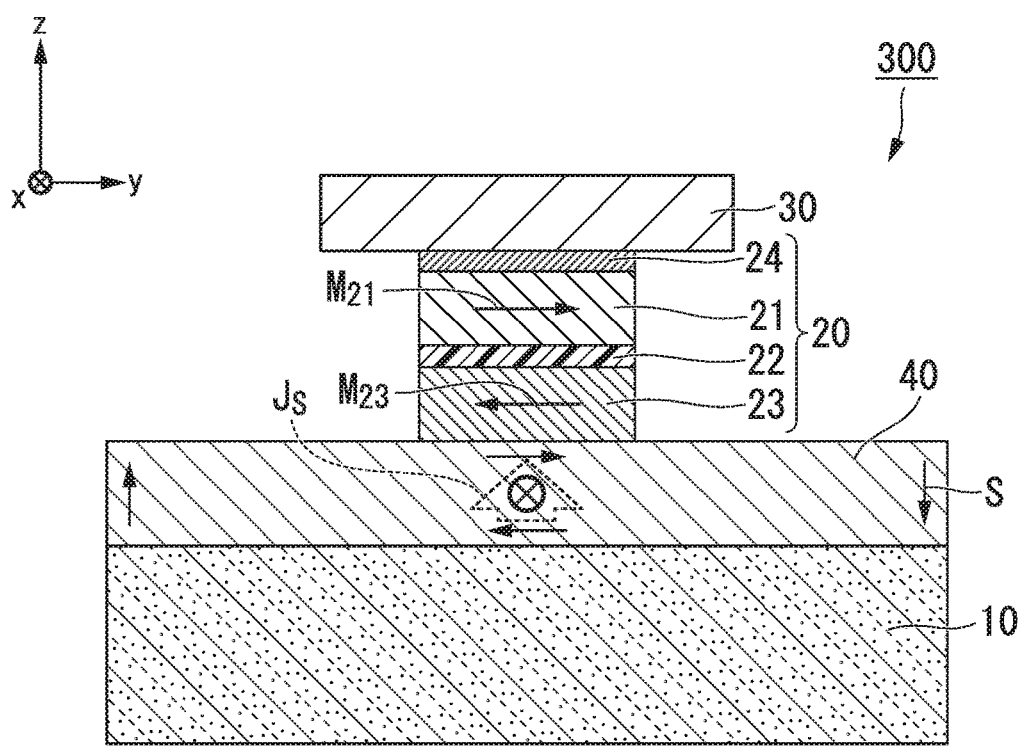
FIG. 12 is a schematic cross-sectional view illustrating a section cut through the yz plane of a magnetoresistance effect element according to yet another embodiment of the present disclosure.

FIG. 12 illustrates a magnetoresistance effect element according to yet another embodiment of the present disclosure.

The magnetoresistance effect element 300 illustrated in FIG. 12 has spin-orbit torque wiring 40 on the side of the substrate 10. In this case, the stacking order of the first ferromagnetic metal layer 21 that acts as the fixed layer and the second ferromagnetic metal layer 23 that acts as the free layer is opposite that of the magnetoresistance effect element 100 illustrated in FIG. 1.

In the magnetoresistance effect element 300 illustrated in FIG. 12, the substrate 10, the spin-orbit torque wiring 40, the second ferromagnetic metal layer 23, the non-magnetic layer 22, the first ferromagnetic metal layer 21, the cap layer 24 and the wiring 30 are stacked in that order. Because the second ferromagnetic metal layer 23 is stacked prior to the first ferromagnetic metal layer 21, the second ferromagnetic metal layer 23 is less likely to be affected by lattice strain or the like than in the magnetoresistance effect element 100. As a result, in the magnetoresistance effect element 300, the perpendicular magnetic anisotropy of the second ferromagnetic metal layer 23 is enhanced. Enhancing the perpendicular magnetic anisotropy of the second ferromagnetic metal layer 23 enables the MR ratio of the magnetoresistance effect element to be improved.

Figure 13:
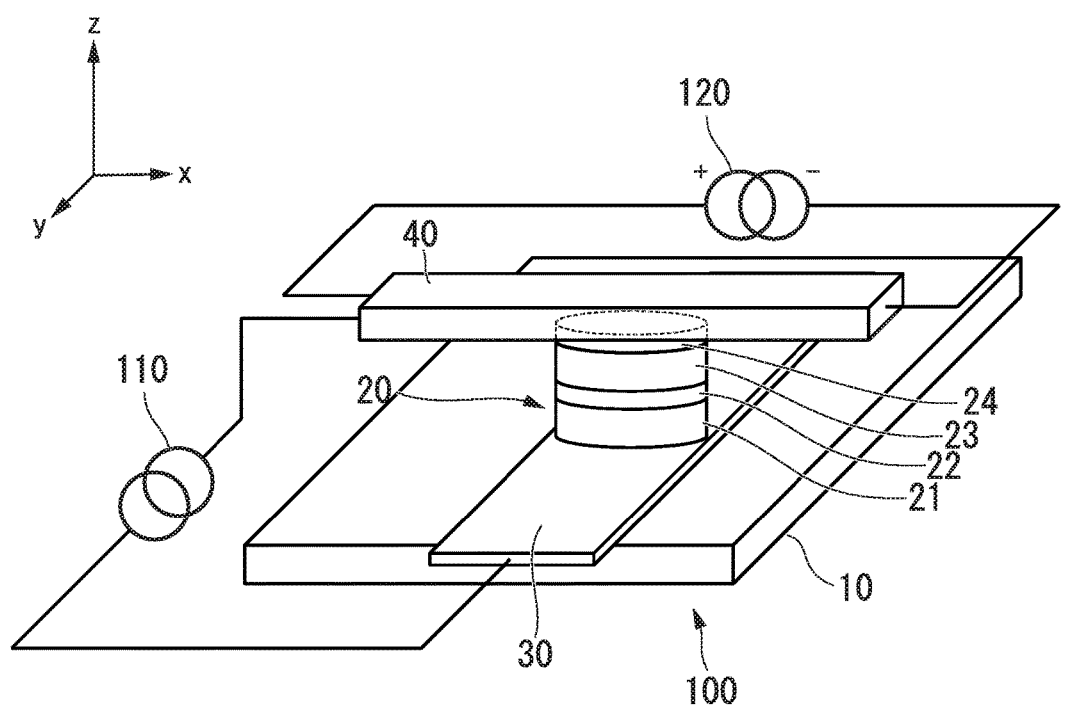
FIG. 13 is a perspective view schematically illustrating a magnetoresistance effect element according to an embodiment of the present disclosure.

FIG. 13 illustrates a configuration in which a first power supply 110 for passing an electric current through the stacking direction of the magnetoresistance effect element 20 and a second power supply 120 for passing an electric current through the spin-orbit torque wiring 40 are provided in the magnetoresistance effect element 100 illustrated in FIG. 1.

In the magnetoresistance effect element 100 of the embodiment of the present disclosure illustrated in FIG. 5 and FIG. 13, a so-called bottom pin structure was presented as an example, in which the second ferromagnetic metal layer 23, which is stacked later in the stacking process and is positioned distant from the substrate 10, functions as the free magnetization layer, and the first ferromagnetic metal layer 21, which is stacked earlier in the stacking process and is positioned close to the substrate 10, functions as the fixed magnetization layer (the pin layer), but the structure of the magnetoresistance effect element 100 is not limited to this type of structure, and a so-called top pin structure may also be used.

The first power supply 110 is connected to the wiring 30 and the spin-orbit torque wiring 40. The first power supply 110 is able to control the electric current that flows through the stacking direction of the magnetoresistance effect element 100.

The second power supply 120 is connected to the two ends of the spin-orbit torque wiring 40. The second power supply 120 is able to control the electric current that flows through the spin-orbit torque wiring 40, which is a current that flows in a directional orthogonal to the stacking direction of the magnetoresistance effect element 20.

As described above, the electric current flowing through the stacking direction of the magnetoresistance effect element 20 induces STT. In contrast, the electric current flowing through the spin-orbit torque wiring 40 induces SOT. Both the STT and the SOT contribute to the magnetization rotation of the second ferromagnetic metal layer 23.

In this manner, by using two power supplies to control the amounts of electric current flowing through the stacking direction of the magnetoresistance effect element 20 and the direction orthogonal to this stacking direction, the rates of contribution of SOT and STT to the magnetization rotation can be controlled freely.

For example, in those cases where a large current cannot be passed through a device, the power supplies can be controlled so that STT, which has a higher energy efficiency relative to magnetization rotation, provides the main contribution. In other words, the amount of current flowing from the first power supply 110 can be increased, while the amount of current flowing from the second power supply 120 is decreased.

Further, in those cases where a thin device is required, and the thickness of the non-magnetic layer 22 must be reduced, it is desirable to reduce the electric current flowing through the non-magnetic layer 22. In such cases, the amount of current flowing from the first power supply 110 can be reduced, and the amount of current flowing from the second power supply 120 can be increased, thereby increasing the contribution rate of SOT.

Conventional power supplies can be used for the first power supply 110 and the second power supply 120.

As described above, by using a magnetoresistance effect element having the "STT and SOT combination" structure of the present disclosure, the rates of contribution of STT and SOT can be freely controlled by adjusting the amounts of electric current supplied from the first power supply and the second power supply respectively. Accordingly, the rates of contribution of STT and SOT can be freely controlled in accordance with the performance required of the device, meaning the element can function as a more versatile magnetoresistance effect element.

(Magnetic Memory)

Magnetic memory (MRAM) of the present disclosure is provided with a plurality of magnetoresistance effect elements of the present disclosure.

(Magnetization Rotation Method)

A magnetization rotation method is a method of ensuring that the current density flowing through the spin-orbit torque wiring in a magnetoresistance effect element of the present disclosure is less than $1 \times 10^7$ A/cm$^2$.

If the current density of the electric current flowing through the spin-orbit torque wiring is too large, then the current flowing through the spin-orbit torque wiring generates heat. If heat is applied to the first ferromagnetic metal layer, then the stability of the magnetization of the first ferromagnetic metal layer tends to deteriorate, and unexpected magnetization rotations or the like can sometimes occur. If this type of unexpected magnetization rotation occurs, then a problem can arise in which recorded information is rewritten. In other words, in order to avoid unexpected magnetization rotation, it is preferable that the current density of the electric current flowing through the spin-orbit torque wiring is prevented from becoming too large. Provided the current density of the electric current flowing through the spin-orbit torque wiring is less than $1 \times 10^7$ A/cm$^2$, at least magnetization rotations caused by generated heat can be avoided.

In the case of a magnetization rotation method in which an "STT and SOT combination" structure is used for the magnetoresistance effect element of the present disclosure, an electric current may first be applied to the power supply for the spin-orbit torque wiring, with an electric current then subsequently applied to the power supply for the magnetoresistance effect element.

The SOT magnetization rotation step and the STT magnetization rotation step may be performed simultaneously, or the SOT magnetization rotation step may be performed first, and the STT magnetization rotation step then performed thereafter. In other words, in the magnetoresistance effect element portion 100 illustrated in FIG. 13, electric currents may be supplied simultaneously from the first power supply 110 and the second power supply 120, or an electric current may first be supplied from the second power supply 120, and then an electric current supplied from the first power supply 110 thereafter, but in order to more reliably obtain a magnetization rotation assist effect using SOT, it is preferable that an electric current is first applied to the power supply for the spin-orbit torque wiring, and then an electric current is applied to the power supply for the magnetoresistance effect element. In other words, it is preferable that an electric current is first supplied from the second power supply 120, and subsequently, an electric current is supplied from the first power supply 110.

DESCRIPTION OF THE REFERENCE SIGNS

1: Second ferromagnetic metal layer
2: Spin-orbit torque wiring
10: Substrate
20: Magnetoresistance effect element
21: First ferromagnetic metal layer
22: Non-magnetic layer
23: Second ferromagnetic metal layer
23': Connection portion (on the side of the second ferromagnetic metal layer)
24: Cap layer
24': Connection portion (on the side of the cap layer)
30: Wiring
40, 50, 51, 52: Spin-orbit torque wiring
40B: Connection portion
40': Connection portion (on the side of the spin-orbit torque wiring)
41, 41A, 41B: Spin current generation portion
42A, 42B, 42C: Conductive portion
100, 200, 300: Magnetoresistance effect element
101: Spin current magnetization rotational element
I: Electric current
S$^+$: Upward-directed spin
S$^-$: Downward-directed spin
M$_{21}$, M$_{23}$: Magnetization
I$_1$: First current path
I$_2$: Second current path
110: First power supply
120: Second power supply

The invention claimed is:

1. A spin current magnetization rotational element comprising:
    a ferromagnetic metal layer having a variable magnetization direction, and
    spin-orbit torque wiring which is connected to the ferromagnetic metal layer, wherein:
    the ferromagnetic metal layer has a surface that opposes the spin-orbit torque wiring;
    the spin-orbit torque wiring extends beyond the surface in one or more directions parallel to the surface;
    a spin resistance Rs of a connection portion of the spin-orbit torque wiring that is connected to the ferromagnetic metal layer is larger than a spin resistance Rs of the ferromagnetic metal layer; and
    the spin resistance R$_S$, is defined by a formula (1), $$R_s \equiv \frac{\rho \lambda}{A} \qquad (1)$$

in the formula (1), λ represents a spin diffusion length of the material, ρ represents a electrical resistivity of a material, and A represents a cross-sectional area of the material.

2. The spin current magnetization rotational element according to claim 1, wherein
    the spin-orbit torque wiring layer has a spin current generation portion formed from a material that generates a spin current, and a conductive portion, and
    a portion of the spin current generation portion constitutes the connection portion.

3. The spin current magnetization rotational element according to claim 2, wherein an electrical resistivity of the conductive portion is not higher than an electrical resistivity of the spin current generation portion.

4. The spin current magnetization rotational element according to claim 2, wherein the spin current generation portion is formed from a material selected from the group consisting of tungsten, molybdenum, niobium, and alloys containing at least one of these metals.

5. The spin current magnetization rotational element according to claim 1, wherein the spin-orbit torque wiring has a side wall connection portion that contacts a portion of a side wall of the second ferromagnetic metal layer.

6. A magnetoresistance effect element comprising the spin current magnetization rotational element according to claim 1, a first ferromagnetic metal layer having a fixed magnetization orientation, and a non-magnetic layer sandwiched between the first ferromagnetic metal layer and the second ferromagnetic metal layer.

7. The magnetoresistance effect element according to claim 6, wherein the first ferromagnetic metal layer is positioned below the second ferromagnetic metal layer in the stacking direction.

8. Magnetic memory comprising a plurality of the magnetoresistance effect elements according to claim 6.

9. The spin current magnetization rotational element according to claim 2, wherein the spin-orbit torque wiring has a side wall connection portion that contacts a portion of a side wall of the ferromagnetic metal layer.

10. The spin current magnetization rotational element according to claim 3, wherein the spin-orbit torque wiring has a side wall connection portion that contacts a portion of a side wall of the ferromagnetic metal layer.

11. The spin current magnetization rotational element according to claim 4, wherein the spin-orbit torque wiring has a side wall connection portion that contacts a portion of a side wall of the ferromagnetic metal layer.

12. A magnetoresistance effect element comprising the spin current magnetization rotational element according to claim 2, another ferromagnetic metal layer having a fixed magnetization orientation, and a non-magnetic layer sandwiched between the another ferromagnetic metal layer and the ferromagnetic metal layer.

13. A magnetoresistance effect element comprising the spin current magnetization rotational element according to claim 3, another ferromagnetic metal layer having a fixed magnetization orientation, and a non-magnetic layer sandwiched between the another ferromagnetic metal layer and the ferromagnetic metal layer.

14. A magnetoresistance effect element comprising the spin current magnetization rotational element according to claim 4, another ferromagnetic metal layer having a fixed magnetization orientation, and a non-magnetic layer sandwiched between the another ferromagnetic metal layer and the ferromagnetic metal layer.

15. A magnetoresistance effect element comprising the spin current magnetization rotational element according to claim 5, a first ferromagnetic metal layer having a fixed magnetization orientation, and a non-magnetic layer sandwiched between the first ferromagnetic metal layer and the second ferromagnetic metal layer.

16. The magnetoresistance effect element according to claim 12, wherein the another ferromagnetic metal layer is positioned below the ferromagnetic metal layer in the stacking direction.

17. The magnetoresistance effect element according to claim 13, wherein the another ferromagnetic metal layer is positioned below the ferromagnetic metal layer in the stacking direction.

18. The magnetoresistance effect element according to claim 14, wherein the another ferromagnetic metal layer is positioned below the ferromagnetic metal layer in the stacking direction.

19. The magnetoresistance effect element according to claim 15, wherein the first ferromagnetic metal layer is positioned below the second ferromagnetic metal layer in the stacking direction.

20. Magnetic memory comprising a plurality of the magnetoresistance effect elements according to claim 7.

21. The spin current magnetization rotational element according to claim 1, wherein
the spin-orbit torque wiring layer has (1) a spin current generation portion formed from a material that generates a spin current and (2) conductive portions,
the conductive portions are connected to both ends of the spin current generation portion,
the spin current generation portion and a part of the conductive portions constitute the connection portion, and
the part of the conductive portions is connected to the ferromagnetic metal layer.

22. The spin current magnetization rotational element according to claim 1, wherein
the spin-orbit torque wiring layer has (1) a spin current generation portion formed from a material that generates a spin current and (2) a conductive portion,
a first surface of the spin current generation portion is connected to the ferromagnetic metal layer,
a second surface of the spin current generation portion opposite to the first surface and both ends surface of the second surface of the spin current generation portion are connected to the conductive portion, and
a portion of the spin current generation portion constitutes the connection portion.

* * * * *